(12) United States Patent
Kawaguchi et al.

(10) Patent No.: US 7,464,741 B2
(45) Date of Patent: Dec. 16, 2008

(54) PART FEEDING DEVICE AND PART FEEDING METHOD

(75) Inventors: Satoshi Kawaguchi, Fukuoka (JP); Teruo Kawaguchi, Yamanashi (JP); Kiyoshi Imai, Yamanashi (JP); Koji Okawa, Fukuoka (JP); Shuichi Kubota, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 511 days.

(21) Appl. No.: 10/527,668

(22) PCT Filed: Jul. 15, 2003

(86) PCT No.: PCT/JP03/08993

§ 371 (c)(1),
(2), (4) Date: Mar. 11, 2005

(87) PCT Pub. No.: WO2004/026014

PCT Pub. Date: Mar. 25, 2004

(65) Prior Publication Data

US 2006/0011644 A1 Jan. 19, 2006

(30) Foreign Application Priority Data

Sep. 12, 2002 (JP) ............................. 2002-266734
Dec. 10, 2002 (JP) ............................. 2002-358475

(51) Int. Cl.
*B32B 38/10* (2006.01)
*B65H 5/28* (2006.01)

(52) U.S. Cl. .................... 156/584; 156/344; 221/25; 221/72; 221/87; 414/411; 414/416.05

(58) Field of Classification Search ................. 156/344, 156/584; 221/25, 72, 73, 79, 87; 414/411, 414/416.01, 416.03, 416.05, 416.08, 425, 414/811

See application file for complete search history.

(56) References Cited

U.S. PATENT DOCUMENTS

| 4,943,342 A | * | 7/1990 | Golemon | ..................... 156/584 |
| 5,116,454 A | * | 5/1992 | Kurihara | ..................... 156/584 |
| 5,598,986 A | * | 2/1997 | Ando et al. | ............... 242/597.6 |
| 6,379,098 B1 | * | 4/2002 | Shibasaki | .............. 414/416.01 |

FOREIGN PATENT DOCUMENTS

| JP | 46-31249 | 9/1971 |
| JP | 60-137759 | 9/1985 |

(Continued)

*Primary Examiner*—Mark A Osele
(74) *Attorney, Agent, or Firm*—Pearne & Gordon LLP

(57) ABSTRACT

A part feeding device capable of preventing the adhesive surface of a top tape from being exposed even if a pleat line is displaced and easily and collectively removing the top tape collected by winding on a reel body and a part feeding method, the device comprising a top tape transfer part (1) having raising rollers (6) raising the top tape (104) a specified amount by generally 90° with the adhesive surfaces thereof at both ends facing inside, a folding rollers (5) folding the raised top tape by falling on the unraised top tape, and a tape delivery part (18) feeding the folded top tape at a specified pitch, wherein the reel body collecting the peeled top tape can collectively push out the group of the wound top tape in the axial direction.

4 Claims, 23 Drawing Sheets

FOREIGN PATENT DOCUMENTS

| | | |
|---|---|---|
| JP | 02-274431 | 11/1990 |
| JP | 2-276774 | 11/1990 |
| JP | 7-212082 | 8/1995 |
| JP | 11-46091 | 2/1999 |
| JP | 11-180649 | 7/1999 |
| JP | 2000-91790 | 3/2000 |
| JP | 2001-308587 | 11/2001 |

* cited by examiner

PART FEEDING DEVICE AND PART FEEDING METHOD

TECHNICAL FIELD

The present invention relates to a parts supplying system and a parts supplying method employing taped-components used to package the parts such as the chip-type electronic parts and, more particularly, a parts supplying system and a parts supplying method capable of taking out the parts by releasing a releasable top tape from a carrier tape that is covered with the top tape while moving the carrier tape and also capable of discharging or winding/recovering the released top tape.

BACKGROUND ART

In recent years, the electronic parts packaging machine for packaging automatically the chip-type electronic parts, and the like on the board is necessary and indispensable for the step of assembling the electronic circuit board. As the electronic parts packaging machine, there is the machine equipped with the parts supplying system that supplies the parts by employing the taped-components.

The taped-components have such a structure that an upper surface of a carrier tape that contains housing portions to house the chip-type electronic parts, and the like therein is covered with a releasable top tape.

The parts supplying system employing the taped components can take out the electronic parts set in the housing portions of the carrier tape while releasing the top tape that covers the upper surface of the carrier tape, and then supply the parts to the electronic parts packaging machine.

Meanwhile, with improvement of the productivity of the electronic parts packaging machine, recently the exchanging operation of the carrier tape in the parts supplying system is carried out at a short interval.

The top tape released from the carrier tape has an adhesive face on both end portions in the axial direction. Therefore, as the system for processing the released top tape, the system equipped with the mechanism for folding the adhesive face of the released top tape and then discharging the top tape (e.g., see JP-A-2001-308587 (FIG. 4, paragraphs 0051 to 0066): Patent Literature 1) and also the system equipped with the mechanism for winding the released top tape onto the reel member to recover (e.g., JP-A-11-46091: Patent Literature 2 and JP-A-7-212082: Patent Literature 3) were proposed in the prior art.

The technology in the parts supplying system and the parts supplying method disclosed in respective Patent Literatures in the prior art and their problems will be explained hereunder.

At first, the technology in Patent Literature 1 will be explained. FIG. 22 and FIG. 23 show together the parts supplying system disclosed in Patent Literature 1.

FIG. 22(a) is a front view showing a pertinent portion of the parts supplying system in the prior art and FIG. 22(b) is a plan view showing a pertinent portion of the portion. FIG. 23 shows the taped-components, wherein (a) is a front view and (b) is a plan view.

As shown in Figures, housing portions 102 in which an electronic parts 103 is housed respectively are provided to a carrier tape 101 of a taped-components 140, and a surface of the carrier tape is covered with a top tape 104 to prevent the flying-out of the electronic parts.

The top tape and the carrier tape are jointed via the adhesive faces provided to both end portions of the top tape in the axial direction such that the top tape can be released.

The taped-components 140 are wound onto a reel 19 and installed in a parts supplying system 141. Then, the taped-components are put on a feed wheel (not shown) having pin-type projections that are allotted every predetermined angle, and then such taped-components are transferred by the rotation of the feed wheel by a predetermined distance.

When the taped-components are transferred by the feed wheel at a predetermined pitch while releasing the top tape 104, the electronic parts 103 is picked up by a suction nozzle (not shown) of the electronic parts mounting machine.

As shown in FIG. 22(b) the top tape 104 released from the carrier tape is folded in two by a roller 128, which is provided at the rear in the traveling direction of the carrier tape, to have a fold at a center portion of the top tape in its width direction such that both adhesive faces of the top tape come into contact with each other. Then, this top tape is discharged to the outside of the parts supplying system by a discharge roller 113.

However, according to the above configuration, in some cases the fold is displaced when the released top tape is folded double such that the adhesive faces provided to both end portions of the top tape in the width direction are jointed together. In such case, since a part of the adhesive face is exposed and adheres to the feed roller and thus it is possible that such top tape winds round the feed roller, the periodical cleaning working is required.

Also, the top tapes discharged from a plurality of neighboring parts supplying systems are adhered and have got entangled mutually or adhered to the wall surface, etc. of the discharging portion. Therefore, the top tap dispose space cannot be effectively used, and thus a cleaning frequency of the dispose space is increased.

In addition, there existed the problem that, if the released top tape is fed into the feed roller in its flat state without the folding, such top tape is discharged continuously in its flat state as it is and thus such top tape is never folded in two.

Next, the technologies disclosed in Patent Literature 2 and Patent Literature 3 will be explained hereunder.

In the parts supplying system disclosed in Patent Literature 2, the carrier tape which has the housing portions for the electronic parts and an upper surface of which is covered with the releasable top tape is transferred along the transfer surface, and then the electronic parts can be taken out from the housing portion by winding the carrier tape onto the reel member while releasing the top tape from the carrier tape. In this parts supplying system, the winding face of the reel member is formed into a shape that is inclined toward the guide flange side provided to one end face of the winding drum, and then the top tape is wound on the reel member along the guide flange side.

According to such configuration, the top tape can always be wound onto the reel member in a stable state, the removing operation of the reel member can be executed without trouble, and the rotating resistance of the winding ratchet can be reduced. As a result, the parts supplying system that can prevent the deformation of the winding ratchet not to make the winding failure can be provided, so that improvement in a supply rate of the electronic parts and productivity can be achieved.

Also, in the parts supplying system disclosed in Patent Literature 3, while the taped-components that are housed in the housing tape at a predetermined pitch in the longitudinal direction and covered with the top tape are moved in the longitudinal direction, the parts are supplied sequentially to a predetermined position by separating the top tape from the housing tape in the middle of this moving. In this parts supplying system, the reel for winding the separated top tape has the reel member that the winding drum detachably attached to the driving shaft and the guide flange provided to one end portion of the drum, the auxiliary ring made of inelastic material and having the detent engaging portion is fitted removably onto the outer periphery of the winding drum of the reel member, and the top tape is wound onto the outer periphery of the auxiliary ring.

Also, jig through holes are provided in appropriate numbers in the outer peripheral position of the winding drum of the guide flange portion of the reel member.

According to such configuration, because the auxiliary ring is made of the inelastic material, such a situation is never caused that the auxiliary ring is fitted tightly by the winding pressure when the auxiliary ring fitted onto the winding drum is removed together with the top tape wounded onto this ring, and thus the auxiliary ring can be removed easily from the winding drum. Also, since no obstacle such as the guide flange is present around the removed auxiliary ring and a separating force can be applied from every portion around the periphery, the top tape can be removed easily and quickly. In addition, since the jig through holes are provided in the guide flange, the auxiliary ring can be removed simply and quickly from the winding drum by the jig that is inserted into the jig through hole. As a result, the exchange of the supplied parts can be attained in a short time by mounting the reel member again onto the driving shaft.

However, the winding of the top tape by the reel member is executed while releasing the top tape from the carrier tape. Thus, because the releasing resistance is generated, the top tape is often wound relatively tightly and densely onto the winding drum of the reel member.

Therefore, when the parts exchange is generated in the parts supplying system, the top tape must be rewound from the winding drum when the wound top tape is removed from the winding drum. At that time, the top tape cannot be easily removed from the winding drum to consume much time and labor, and the supply of the parts is stopped for this while. Therefore, it is possible that the supply rate of the electronic parts and productivity are lowered.

Also, in the parts supplying system having the auxiliary ring and the jig through holes, the top tape cannot be easily removed from the auxiliary ring when such top tape is wound tightly and densely onto the auxiliary ring. Then, there is such a possibility that the auxiliary ring is lost because the ring prepared as the separate member is used, and thus the overall parts supplying system cannot be used if such ring is lost. In addition, when the ring is removed by using the jig, the jig operation takes much time and also the cost of equipment of the ring and the jig is needed.

The present invention has been made in view of the above circumstances, and it is an object of the present invention to provide a parts supplying system and a parts supplying method capable of preventing exposure of an adhesive face of the released top tape even if a fold is displaced in the case where the adhesive face of the released top tape is to be folded/ processed and capable of folding automatically the adhesive face unless the top tape is previously folded and fed to a feed roller, and also provide a parts supplying system capable of removing easily, quickly, and surely the top tape, which is rolled tightly and densely round a winding drum, not to use a ring and a jig in the case where the released top tape is to be wound on a reel member to recover/process, whereby improvement in a supply rate of the electronic parts and productivity can be achieved.

DISCLOSURE OF THE INVENTION

The above object can be attained by providing following configurations.

(1) A parts supplying system comprising a top tape carrying portion for releasing a top tape pasted onto a carrier tape from the carrier tape to carry when a parts housed in the carrier tape is supplied by feeding intermittently a taped-component, in which the top tape having an adhesive face on both end portions in a width direction is pasted releasably on the carrier tape in which the parts is stored, to a parts supplying position, wherein the top tape carrying portion includes a tape lifting portion for lifting a predetermined length of the top tape by almost 90degree to direct respective adhesive faces on both ends inwardly, a tape folding portion for folding the top tape by tilting a lifted top tape toward a not-lifted top tape, and a tape discharging portion for feeding the folded top tape every predetermined pitch.

When doing this, the top tape can be lifted by almost 90 degree to direct respective adhesive faces on both ends inwardly by merely passing the top tape through the top tape carrying portion and also the lifted portion of the top tape is tilted inwardly to come into tight contact with the not-lifted portion.

Therefore, the adhesive faces of the top tape can be closed surely, the adhesive component does not adhere onto the contact places in the route for discharging the released top tape, and the periodical cleaning operation can be omitted or reduced.

(2) In the parts supplying system set forth in (1), the tape lifting portion consists of at least one lifting roller, the lifting roller is a roller having a collar on both ends, a dimension between both collars is almost equal to a width dimension of a not-lifted top tape, the released top tape is passed on the lifting roller to direct an adhesive face upwardly, and the lifting roller lifts up the top tape that is passed on the collars along the collars by almost 90 degree, and the tape folding portion consists of a folding roller, the folding roller is positioned in an opposite direction to a direction along which the top tape is lifted to apply a tension to the not-lifted top tape and then folds the top tape by tilting the lifted top tape toward the not-lifted top tape.

When doing this, the adhesive faces on both end portions of the top tape that is pushed by the collar portions when the top tape passes on the lifting roller are lifted by almost 90 degree, and the top tape is pulled by the folding roller in the opposite direction to the direction along which the adhesive faces on both end portions are lifted by almost 90 degree. Therefore, the adhesive faces lifted by almost 90 degree are tilted toward the portion without the collar and then come into tight contact with the not-lifted top tape.

(3) In the parts supplying system set forth in (2), a part of the collars of the lifting roller is notched, the top tape is kept in a flat state in a collar-notched portion, and the top tape that is passed on the collars is lifted along the collars by almost 90 degree in a collar-not-notched portion.

When doing this, the top tape engages with the collars in the collar-notched portion in its flat state, then the top tape causes the lifting roller to rotate by such engagement when the top tape is pulled, and then the adhesive faces on both end portions of the top tape are lifted by almost 90 degree by the collars that are rotated subsequently.

(4) In the parts supplying system set forth in (2), the folding roller and the lifting roller have an almost identical shape respectively.

When doing this, the folding roller engages only with the not-lifted portion of the top tape, and the lifted top tape is tilted easily toward the portion without the collar.

(5) In the parts supplying system set forth in (2), a crease roller that engages with the released top tape before the top tape comes up to the lifting roller is provided, the crease roller contacts to a surface of the top tape having A parts supplying method of releasing a top tape pasted onto a carrier tape from the carrier tape to carry when a parts housed in the carrier tape is supplied by feeding intermittently a taped-component, in which the top tape having an adhesive face on both end portions in a width direction is pasted releasably on the carrier tape in which the parts is stored, to a parts supplying position, wherein a predetermined length of the released top tape is lifted by almost 90 degree to direct respective adhesive faces on both ends of the top tape inwardly, the top tape is folded by tilting a lifted top tape toward a not-lifted top tape, and the folded top tape is fed every predetermined pitch.

When doing this, the top tape can be lifted by almost 90 degree to direct respective adhesive faces on both ends inwardly by merely passing the top tape through the top tape carrying portion and also the lifted portion of the top tape is tilted inwardly to come into tight contact with the not-lifted portion.

(7) A parts supplying system capable of taking out an electronic parts from a housing portion by releasing a top tape from a carrier tape, while moving the carrier tape which has the housing portion for the electronic parts and a surface of which is covered with the releasable top tape in a longitudinal direction, to wind on a reel member, wherein the reel member includes a winding drum detachably attached to a driving shaft, and a guide flange formed on one end face of the winding drum and having an opening portion through which a side surface of the top tape wound on the winding drum is pushed directly with a finger.

When doing this, the method of removing collectively the top tape from the winding drum in the axial direction by detaching the reel member from the driving shaft and then applying the force to the side surface of the top tape through the opening portion of the guide flange can be employed as the method of removing the top tape wound on the reel member. Therefore, the pushing force of the finger can be applied directly to the side surface of the top tape that is wound tightly and densely on the winding drum, and removal of the top tape from the reel member can executed easily and quickly without fail. Further, in the parts supplying system having the above structure, the opening portion through which the side surface of the top tape can be pushed is provided in the guide flange formed on one end face of the winding drum, and then the top tape wound on the winding drum can be removed by pushing directly the tape by the finger. Therefore, the ring as the separated member can be omitted and the inoperable state of the parts supplying system because of loss of the ring is not caused.

In addition, there is no necessity to remove the ring by using the jig and thus time and labor required for the jig operation is not needed. Further, the ring and the jig are not needed, the cost of equipment of them is not generated.

(8) A parts supplying system set forth in (7), wherein the reel member includes a pair of winding drums detachably attached to a driving shaft that rotates/drives the reel member, having a winding surface on respective outer peripheral surfaces, and divided in two in an axial direction, one part being detachably attached to the driving shaft, and a guide flange formed on one end face of one winding drum, whereby the top tape is wound on winding surfaces of the pair of winding drums.

In the reel member of this parts supplying system, the top tape is wound on a pair of winding drums to spread over the winding surfaces respectively. That is, one end side of the top tape in the width direction is wound on one winding drum whereas the other end side in the width direction is wound on the other winding drum. Therefore, the top tape is still wound only on one winding drum by separating a pair of winding drums on which the top tape is wound. As a result, the contact friction between the top tape and the winding surfaces can be reduced largely and thus removal of the top tape from the winding drum can be made easy.

Therefore, like the case in above (8), the method of removing the top tape, which is wound tightly and densely on the winding drum, from the winding drum collectively, easily, and quickly without fail in the axial direction can be employed.

(9) A parts supplying system capable of taking out an electronic parts from a housing portion by releasing a top tape from a carrier tape, while moving the carrier tape which has the housing portion for the electronic parts and a surface of which is covered with the releasable top tape in a longitudinal direction, to wind on a reel member, wherein the reel member includes a pair of winding drums detachably attached to a driving shaft that rotates/drives the reel member, having a winding surface on respective outer peripheral surfaces, and divided in two in an axial direction, one part being detachably attached to the driving shaft, and a guide flange formed on one end face of one winding drum, whereby the top tape is wound on winding surfaces of the pair of winding drums, the pair of winding drums have a tapered winding surface whose outer diameter is increased large in a direction that goes away from the guide flange, and an outer diameter of an end face of the other winding drum opposing to the other end face of one winding drum is smaller than an outer diameter of the other end face of one winding drum.

In the reel member of this parts supplying system, respective winding surfaces of a pair of winding drums are formed from the reel member can executed easily and quickly without fail.

Further, in the parts supplying system having the above structure, the opening portion through which the side surface of the top tape can be pushed is provided in the guide flange formed on one end face of the winding drum, and then the top tape wound on the winding drum can be removed by pushing directly the tape by the finger. Therefore, the ring as the separated member can be omitted and the inoperable state of the parts supplying system because of loss of the ring is not caused. In addition, there is no necessity to remove the ring by using the jig and thus time and labor required for the jig operation is not needed. Further, the ring and the jig are not needed, the cost of equipment of them is not generated.

(8) A parts supplying system capable of taking out an electronic parts from a housing portion by releasing a top tape from a carrier tape, while moving the carrier tape which has the housing portion for the electronic parts and a surface of which is covered with the releasable top tape in a longitudinal direction, to wind on a reel member, wherein the reel member includes a pair of winding drums detachably attached to a driving shaft that rotates/drives the reel member, having a winding surface on respective outer peripheral surfaces, and divided in two in an axial direction, one part being detachably attached to the driving shaft, and a guide flange formed on one end face of one winding drum, whereby the top tape is wound on winding surfaces of the pair of winding drums.

In the reel member of this parts supplying system, the top tape is wound on a pair of winding drums to spread over the winding surfaces respectively. That is, one end side of the top tape in the width direction is wound on one winding drum whereas the other end side in the width direction is wound on the other winding drum. Therefore, the top tape is still wound only on one winding drum by separating a pair of winding drums on which the top tape is wound. As a result, the contact friction between the top tape and the winding surfaces can be reduced largely and thus removal of the top tape from the winding drum can be made easy.

Therefore, like the case in above (8), the method of removing the top tape, which is wound tightly and densely on the winding drum, from the winding drum collectively, easily, and quickly without fail in the axial direction can be as tapered surfaces in the same direction, and in addition the outer diameter of the other winding drum opposing to the other end face of one winding drum is formed smaller than an outer diameter of the other end face of one winding drum. Thus, a level difference is formed at the boundary portion between the winding drums. Therefore, if a pair of winding drums on which the top tape is wound can be separated by forming the level difference at the boundary portion between the winding drums, not only both winding drums can be separated in the situation that the top tape is put on one winding drum and held thereon but also a contact friction between the other winding drum and the top tape can be reduced by the level difference and the tapered surfaces and a separating force can be reduced.

Therefore, like the case in above (8), the method of removing the top tape, which is wound tightly and densely on the winding drum, from the winding drum collectively, easily, and quickly without fail in the axial direction can be employed.

(10) A parts supplying system set forth in (7), wherein the reel member includes a winding drum detachably attached to a driving shaft that rotates/drives the reel member and having a recess portion that is hollowed inwardly in a radial direction in a part of a circumference, and a guide flange formed on one end face of the winding drum".

In the reel member of this parts supplying system, the top tape wound on the winding surface of the winding drum does not contact to the winding surface in the recess portion and can be deformed in the depth direction of the recess portion. In other words, the wound top tape is ready to be removed from the winding surface if the top tape is deformed (crashed) in the direction along which such top tape is pushed into the recess portion. In this manner, if a part of the wound top tape in the circumferential direction is removed in the recess portion, a winding/clamping force generated by winding the tape on the whole circumference of the winding surface disappears, and thus the wound top tape is ready to be removed collectively from the winding drum.

Therefore, like the case in above (8), the method of removing the top tape, which is wound tightly and densely on the winding drum, from the winding drum collectively, easily, and quickly without fail in the axial direction can be employed.

(11) A parts supplying system capable of taking out an electronic parts from a housing portion by releasing a top tape from a carrier tape, while moving the carrier tape which has the housing portion for the electronic parts and a surface of which is covered with the releasable top tape in a longitudinal direction, to wind on a reel member, wherein the reel member includes a winding drum detachably attached to a driving shaft that rotates/drives the reel member, and a guide flange formed on one end face of the winding drum, whereby the winding drum and the guide flange are bent in removing from the driving shaft to position the winding drum on an inner side and the guide flange on an outer side.

In this parts supplying system, since the winding drum and the guide flange are bent in removing from the driving shaft to position the winding drum on the inner side and the guide flange on the outer side, the winding/tightening force of the wound top tape disappears and thus the wound top tape can be removed from the winding surface. Therefore, the wound top tape can be removed simply from the winding surface.

Therefore, like the case in above (8), the method of removing the top tape, which is wound tightly and densely on the winding drum, from the winding drum collectively, easily, and quickly without fail in the axial direction can be employed.

(12) In the parts supplying system set forth in any one of (7), (10) or (11), the winding drum has a tapered winding surface whose outer diameter is increased large in a direction that goes away from the guide flange.

In the reel member of this parts supplying system, the top tape that is wound along the guide flange side, and thus the top tape can always be wound stably on the winding surface. As a result, the attaching/detaching operation of the winding drum can be facilitated. Also, the rotating resistance of the winding ratchet can be reduced, the deformation of the winding ratchet can be prevented, and the winding failure is not generated.

Therefore, like the case in above (8), the method of removing the top tape, which is wound tightly and densely on the winding drum, from the winding drum collectively, easily, and quickly without fail in the axial direction can be employed.

(13) In the parts supplying system set forth in (10), inner wall surfaces opposing to on both ends of the recess portion in a circumferential direction are In the reel member of this parts supplying system, the top tape that is wound along the guide flange side, and thus the top tape can always be wound stably on the winding surface. As a result, the attaching/detaching operation of the winding drum can be facilitated. Also, the rotating resistance of the winding ratchet can be reduced, the deformation of the winding ratchet can be prevented, and the winding failure is not generated.

Therefore, like the case in above (8), the method of removing the top tape, which is wound tightly and densely on the winding drum, from the winding drum collectively, easily, and quickly without fail in the axial direction can be employed.

(13) In the parts supplying system set forth in (10), inner wall surfaces opposing to on both ends of the recess portion in a circumferential direction are formed as a tapered surface that expands outwardly in a radial direction.

In the reel member of this parts supplying system, the inner wall surfaces on both ends of the recess portion in the circumferential direction are formed as a taper surface that is expanded toward the outside in the radial direction. Therefore, a corner portion (edge portion) at which the inner wall surface and the winding surface forms an obtuse angle, and thus the sticking in removing the top tape due to the event that the edge portion bites into the inner peripheral surface side of the top tape can be reduced. That is, the top tape can be removed more easily.

Therefore, like the case in above (8), the method of removing the top tape, which is wound tightly and densely on the winding drum, from the winding drum collectively, easily, and quickly without fail in the axial direction can be employed.

(14) In the parts supplying system set forth in (10), an opening portion through which a side surface of the top tape wound on the winding drum is pushed is formed in the guide flange, and the opening portion and the recess portion are arranged on a straight line in the radial direction of the guide flange.

In the reel member of this parts supplying system, the opening portion and the recess portion are arranged on a straight line in the radial direction of the guide flange. Therefore, the pushing force can be applied to the side surface of the wound top tape on the recess portion via the opening portion, and thus the pushing force in removing the top tape from the recess portion can be applied effectively to the side surface of the top tape near the recess portion.

Therefore, like the case in above (8), the method of removing the top tape, which is wound tightly and densely on the winding drum, from the winding drum collectively, easily, and quickly without fail in the axial direction can be employed.

(15) In the parts supplying system set forth in any one of (7), (8), (10) or (11), an inner side surface of the guide flange is formed as an inclined surface that reduces a thickness of the guide flange outwardly in the radial direction of the guide flange.

In the reel member of this parts supplying system, the top tape that is wound on the winding surface of the winding drum is inclined and guided toward the guide flange side. Since the top tape can always be wound stably along the guide flange side of the winding surface, the attaching/detaching operation of the winding drum can be facilitated and the rotating resistance of the winding ratchet can be reduced.

Therefore, like the case in above (8), the method of removing the top tape, which is wound tightly and densely on the winding drum, from the winding drum collectively, easily, and quickly without fail in the axial direction can be employed.

Figure 1:
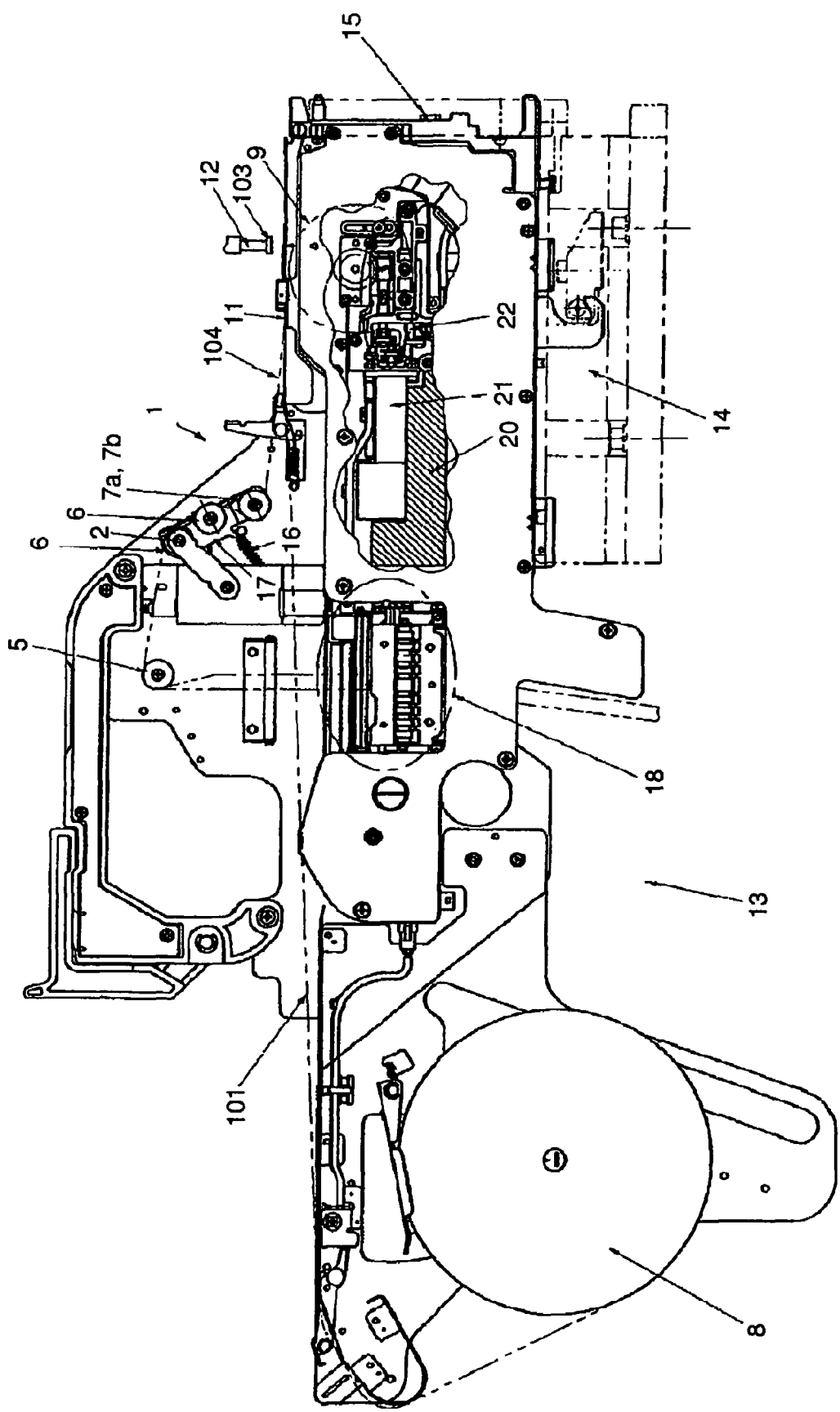
FIG. 1 is a front view showing a first embodiment of the present invention.
Figure 2:
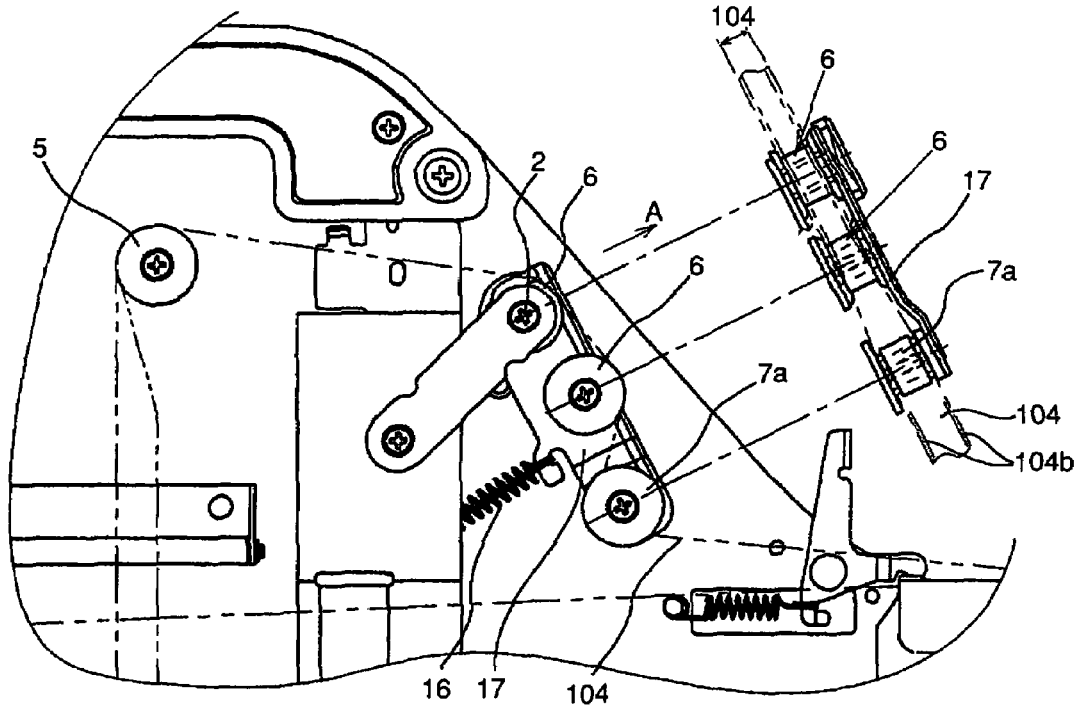
FIG. 2 is an explanatory view of a pertinent portion, wherein (a) is a detailed view showing a pertinent portion in FIG. 1 and (b) is a right side view showing a pertinent portion of the portion.
Figure 3:
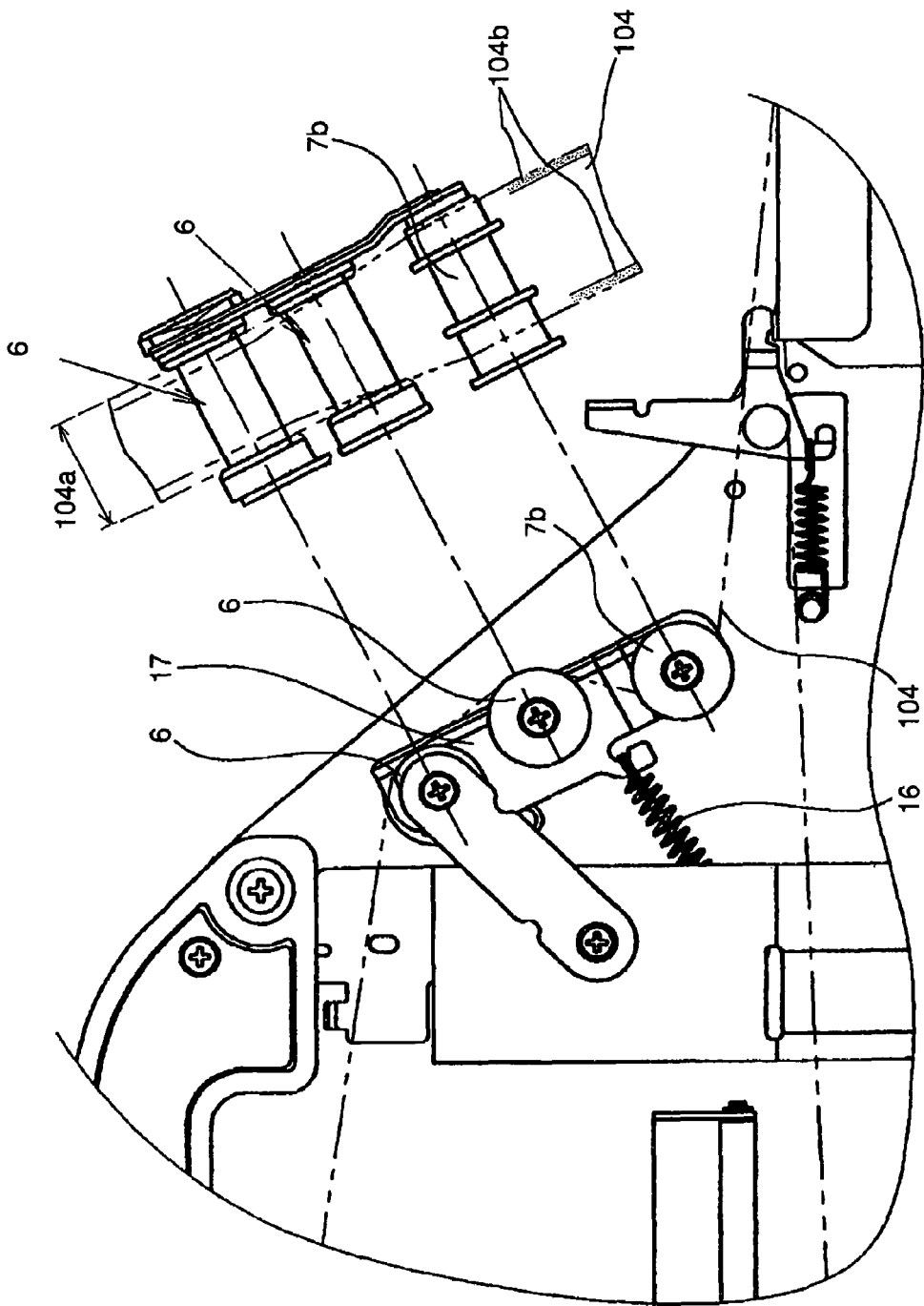
FIG. 3 is an explanatory view of the pertinent portion, wherein (a) is a detailed view showing a pertinent portion in FIG. 1 and (b) is a right side view showing a pertinent portion of the portion.

In above Figures, a reference numeral 1 is a top tape carrying portion, 2 fulcrum, 5 folding roller, 6 lifting roller, 6a collar, 6b dimension between both collars, 6c collar-notched portion, 7a, 7b crease roller, 7c width in which the crease roller contacts to the top tape, 13 electronic parts supplying system, 18 discharging portion, 24 parts supplying system, 27 carrier tape, 28 top tape, 49, 81, 91 reel member, 51 driving shaft, 52, 53, 83 winding drum, 52a, 53a, 83a winding surface, 54 guide flange, 54a inner side face of the guide flange, 67 opening portion, 85 recess portion, 87 inner wall surface, 101 carrier tape, 102 housing portion, 103 electronic parts, 104 top tape, 104b adhesive face, 104c lifted top tape, 104d not-lifted top tape, 140 taped-components, and A is a direction along which the top tape is lifted.

BEST MODE FOR CARRYING OUT THE INVENTION

Various parts supplying systems and various parts supplying methods according to preferred embodiments of the present invention will be explained in detail with reference to the accompanying drawings hereinafter.

FIRST EMBODIMENT

FIG. 1 to FIG. 6 show a first embodiment of a parts supplying system according to the present invention.

A parts supplying system and a parts supplying method of the first embodiment of the present invention will be explained with reference to FIG. 1 to FIG. 6 and FIG. 23 hereinafter. In this case, in FIG. 1 to FIG. 6, the same reference symbols are affixed to the elements having the same functions as the prior art.

FIG. 1 is a front view showing a first embodiment of the present invention.

In FIG. 1, an electronic parts supplying system 13 is fitted to a fitting portion 14 of the electronic parts packaging machine, and operates a motor portion 21 based on information set previously in a control board 20 when the system receives a signal from the electronic parts packaging machine via an interface connector portion 15. At this time, a feed wheel 9 that is coupled to the motor via a gear driving portion 22 is operated by a predetermined amount. Pin-type projections are allotted onto the outer peripheral portion of the feed wheel every predetermined angle. Holes 101a provided to the carrier tape 101 for the taped-components 140 engage with the projections to transfer the taped-components.

At the same time, the top tape 104 is released from the carrier tape 101 by a releasing portion 11, and then the electronic parts 103 stored in the carrier tape is exposed and also is moved to an electronic parts suction position in the electronic parts packaging machine with the transfer of the carrier tape. Then, the electronic parts 103 is picked up by a suction nozzle 12 in the electronic parts packaging machine and carried to an electronic parts packaging position.

The top tape 104 after released is carried by a top tape carrying portion 1 and discharged to the outside of the parts supplying system 13. This top tape carrying portion 1 has a tape lifting portion for lifting a predetermined length of the top tape by almost 90 degree to direct respective adhesive faces on both ends of the top tape inwardly, a tape folding portion for folding the top tape by tilting a lifted portion of the top tape toward a not-lifted portion of the top tape, and a tape discharging portion 18 for feeding the folded top tape every predetermined length.

Then, the top tape carrying portion 1 will be explained in accordance with the carrying route of the released top tape 104. The released top tape 104 (referred simply to as the "top tape" hereinafter) is transferred while directing the adhesive face upwardly to bring the side with the adhesive face into contact with crease rollers 7a, 7b. Then, the side without the adhesive face is brought into contact with a lifting roller 6 as the tape lifting portion, then the side without the adhesive face is brought into contact with a folding roller 5 as the tape folding portion, and then the top tape is sent into the tape discharging portion 18.

The crease rollers 7a, 7b and the lifting roller 6 are supported rotatably onto a lever 17 that can swing on a fulcrum 2. An extension spring 16 acts on the lever 17 to apply a predetermined tension to the top tape 104 on the crease rollers 7a, 7b, the lifting roller 6, and the folding roller 5. Thus, when the top tape is released from the carrier tape, sudden application of the force can be prevented and smooth release can be achieved.

Figure 4:
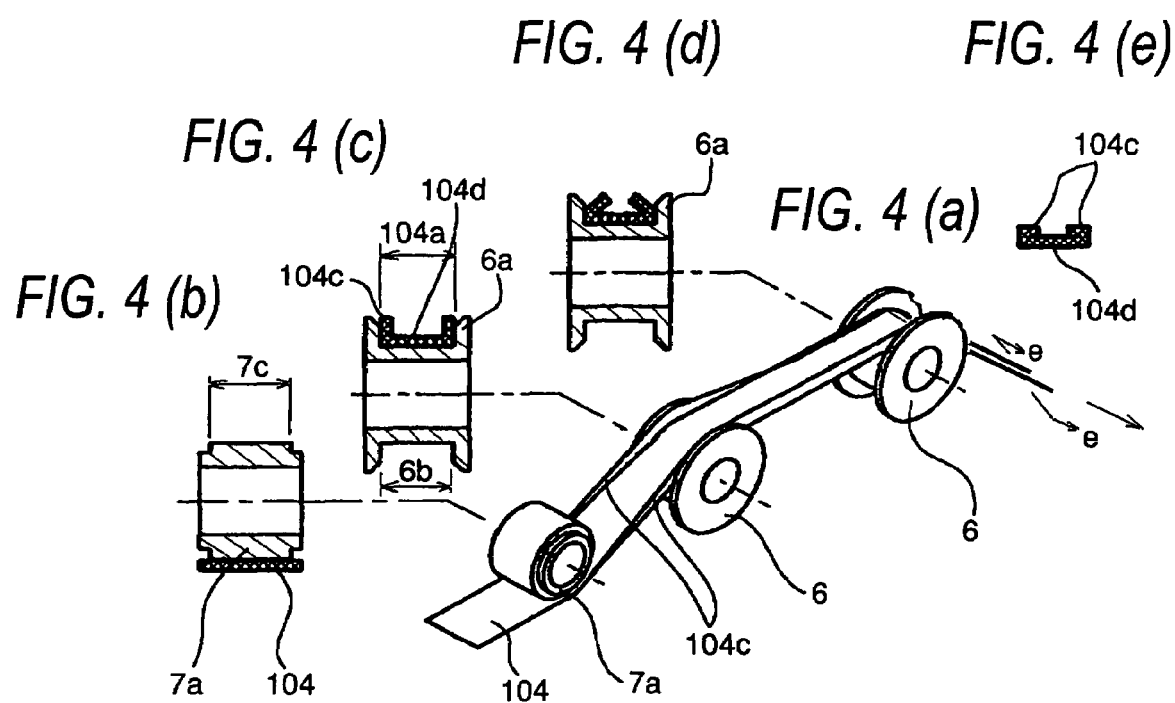
FIG. 4 is an explanatory view of the pertinent portion, wherein (a) is a perspective view showing a relationship among a top tape, a crease roller, and a lifting roller in FIG. 2, (b) is a sectional view showing a relationship between the top tape and the crease roller in (a), (c)(d) are a sectional view showing a relationship between the top tape and the lifting roller in (a) respectively, and (e) is a sectional view viewed along the direction indicated by an arrow in (a).

The tape lifting portion consists of at least one lifting roller 6. As shown in FIG. 4, the lifting roller 6 is a roller having a collar 6a on both ends. A dimension 6b between both collars 6a is almost equal to a width dimension 104a of a not-lifted top tape 104d. The released top tape 104 is passed on the lifting roller 6 to direct an adhesive face 104b upward, and then the lifting roller 6 lifts up the top tape, which is passed on the collars 6a, along the collars 6a by almost 90 degree, as shown in FIG. 4(c).

In this case, if two lifting rollers 6 are provided in series, the top tape can be lifted without fail even though such top tape is hard to rise because of the material, or the like.

Figure 6:
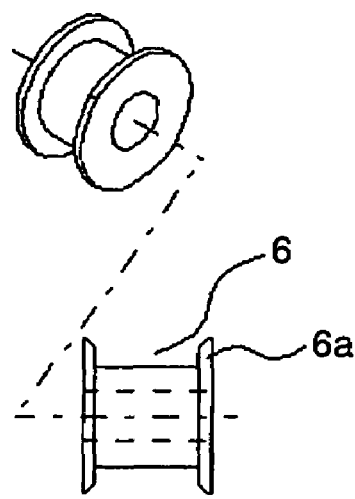
FIG. 6 is an explanatory view of the pertinent portion, wherein (a) is a detailed view showing a lifting roller in FIG. 1, (b) is a detailed view showing the lifting roller having a collar-notched portion in (a), and (c) is a detailed view showing the lifting roller having a small collar-notched portion in (b).
Figure 6:
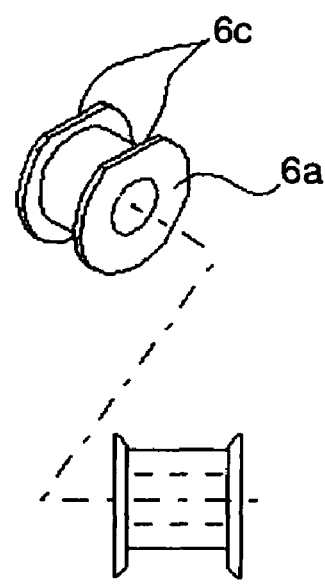
Figure 6:
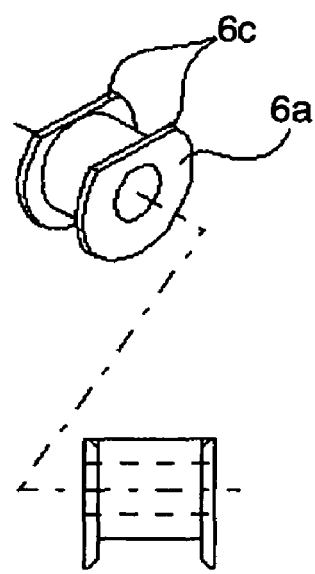

Also, as shown in FIG. 6, the lifting of the top tape is facilitated by cutting away a part of the collars 6a. This is because the top tape 104 engages with a collar-notched portion 6c in its flat state, then the top tape causes the lifting roller 6 to rotate by such engagement when the top tape 104 is pulled, and then both end portions of the top tape 104 are lifted by almost 90 degree by the collars 6a that are rotated subsequently. This structure becomes an effective means particularly in the case where the lifting roller 6 is hard to rotate.

In this case, in the embodiment shown in FIG. 6, the collar-notched portion 6c is formed into a so-called D-cut shape. But any shape may be employed if a sectional shape of the collar 6a is a non-circular shape. For example, a rectangle or a polygon can apply a rotating force to the lifting roller 6.

Also, as shown in FIGS. 6(b) and (c), if the chamfering is formed on the side, which is directed to the roller center side, of the collar-notched portion 6c, the lifting of the top tape is further facilitated.

Also, if the portion in which the collar is notched perfectly to increase the rotating force acting to the top tape, as shown in FIG. 6(b), is provided in the first position of two lifting rollers 6 and the portion in which the collar is notched by a small amount to lower the rotating force acting to the top tape, as shown in FIG. 6(c), is provided in the second position, the lifting action is actuated stepwise to the top tape and thus the top tape can be lifted smoothly.

Also, the lifting of the top tape may be executed by providing a rotating/driving source to the lifting rollers 6 to rotate in cooperation with the drive of the tape discharging portion 18.

Then, the tape folding portion consists of the folding roller 5. Since this folding roller 5 is positioned in the opposite direction to the direction indicated by an arrow A along which the top tape is lifted, a radius of curvature of the top end portion of a lifted top tape 104c is larger than that of the not-lifted top tape 104d. Therefore, a large tension is applied to the top end portion of the lifted top tape 104*c*, nevertheless the lifted top tape 104*c* is not so extended to absorb a difference between both radii of curvature. As a result, the lifted top tape 104*c* is tilted toward the portion without the collar 6*a*, i.e., as shown in FIG. 4(*e*), the lifted top tape 104*c* is tilted toward the not-lifted top tape 104*d* and then folded.

Here it is preferable that the folding roller and the lifting roller are shaped into the almost same shape respectively. With this arrangement, even if the top tape is lifted insufficiently by the lifting roller, the lifting of the top tape can be supplemented by the collar similar to the lifting roller and then the lifted top tape can be tilted surely toward the portion without the collar.

The tape discharging portion 18 discharges the folded top tape to the outside of the parts supplying system by putting the tape between rollers that are provided in a discharge unit and formed like a gear shape. Even though the top tape is put between the rollers in a flat state to be discharged to the outside of the parts supplying system, both end portions of the top tape are tilted inwardly perfectly by the tape folding portion and are brought into their closed state. Therefore, the top tape the adhesive faces of which are closed mutually can be discharged without the intension of doing so at the time of first setting.

Also, if the top tape 104 is caused to engage with the crease rollers 7*a*, 7*b* while directing upwardly the adhesive face 104*b* formed on both end portions in the width direction before the top tape comes up to the lifting roller 6, both end portions of the top tape in the width direction are folded freely at the end faces that contact to he rollers 7*a*, 7*b* in the width direction. Therefore, since the crease is formed at that place, the top tape can be lifted easily from the creased portion by the lifting roller 6.

As showing in FIG. 4(*b*), if a width 7*c* in which the crease roller contacts to the top tape is set almost equal to the dimension 6*b* between both collars 6*a* of the lifting roller 6, the crease can be formed at the place where the top tape is to be lifted.

Figure 5:
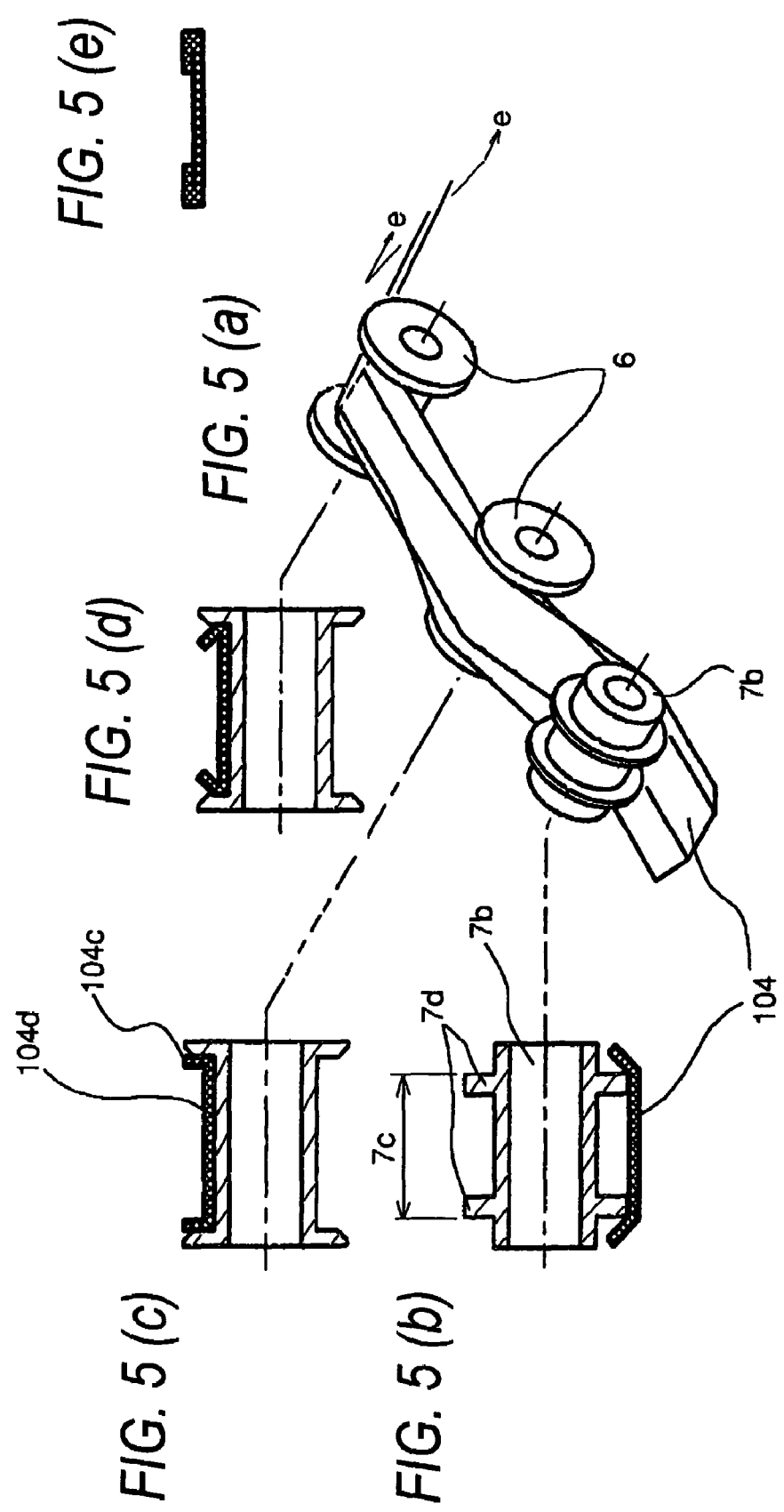
FIG. 5 is an explanatory view of the pertinent portion, wherein (a) is a perspective view showing a relationship among a top tape, a crease roller, and a lifting roller in FIG. 3, (b) is a sectional view showing a relationship between the top tape and the crease roller in (a), (c)(d) are a sectional view showing a relationship between the top tape and the lifting roller in (a) respectively, and (e) is a sectional view viewed along the direction indicated by an arrow in (a).

Also, as shown in FIG. 5(*b*), if collar-like rings 7*d* are provided to positions of the width 7*c*, in which the crease roller comes into contact with the top tape, to use as the crease roller 7*b*, the crease can be formed more strongly. In this case, the rings 7*d* are not always formed integrally with the roller, and two rings may be fixed to the appropriate places.

Also, it is preferable that, in order to avoid the situation that the crease roller 7 contacts to the adhesive face of the top tape after released, the crease roller 7 should be formed as a roller both end portions of which is set lower than a center portion by a level difference of about 1 mm.

Next, a particular example of the first embodiment will be given hereunder.

Dimensions of the top tapes, and the like as the large and small size parts to be supplied will be discussed.

First, as the small size parts, when the dimension 6*b* between both collars 6*a* of the lifting roller was set to 7 mm, the height of the collar was set to 2.5 mm, and the chamfering of the collar was set to C1 in the case where the width of the top tape was set to 9 mm and the width of the adhesive face was set to almost 1 mm, preferred results were derived. Also, the height of the collar was obtained by adding a chamfering margin of the collar to the width of the lifted top tape. Also, if the chamfering was formed on the whole periphery of the intake portion of the collar of the lifting roller, the lifting of both ends of the top tape was facilitated.

Then, as the large size parts, when the dimension 6*b* between both collars 6*a* of the lifting roller 6 was set to 61 mm, the height of the collar was set to 2.5 mm, and the width 7*c* in which the crease roller 7*b* contacts to the top tape was set 55 mm in the case where the width of the top tape was set to 66.5 mm, preferred results were derived.

In this case, for purpose of simplification, explanation was made of the case where both ends of the top tape is lifted by almost 90 degree when the top tape is lifted by the lifting roller along the collar formed to have almost 90 degree to the roller surface. In this case, the numeric value of almost 90 degree is varied largely in dependence on the material, etc. of the top tape, and the lifted top tape can be tilted inwardly by the folding roller if both ends of the top tape are lifted by almost 90 degree after the top tape is passed through the second lifting roller 6. Therefore, the numeric value of almost 90 degree should not be interpreted as the severe numerical restriction.

SECOND EMBODIMENT

FIG. 7 to FIG. 13 show a second embodiment of a parts supplying system according to the present invention.

A parts supplying system in the second embodiment of the present invention and a method of removing the top tape that is recovered in its rolled state in the system will be explained with reference to FIG. 7 to FIG. 13 hereinafter.

Figure 7:
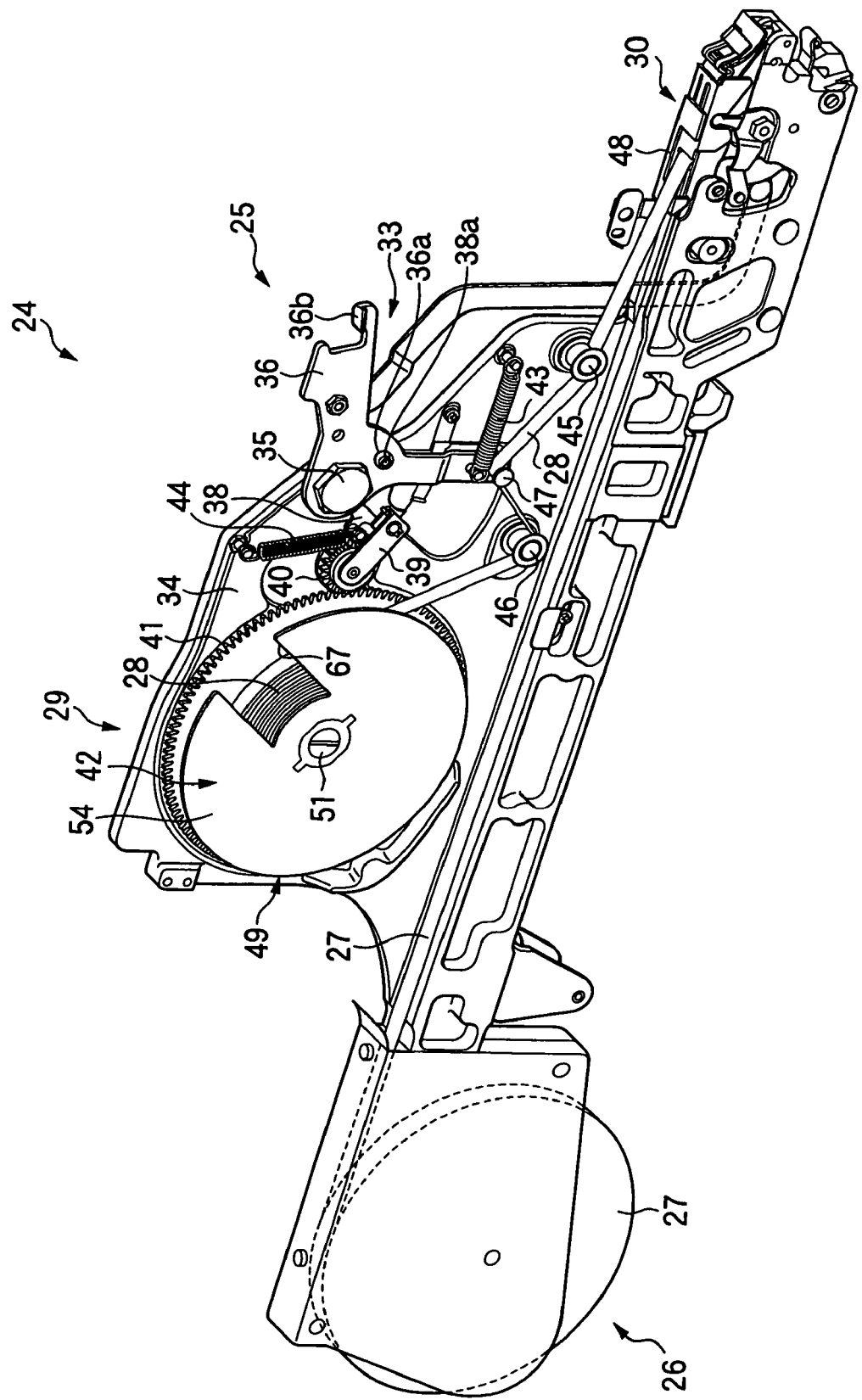
FIG. 7 is a perspective view of a second embodiment of a parts supplying system according to the present invention.
Figure 8:
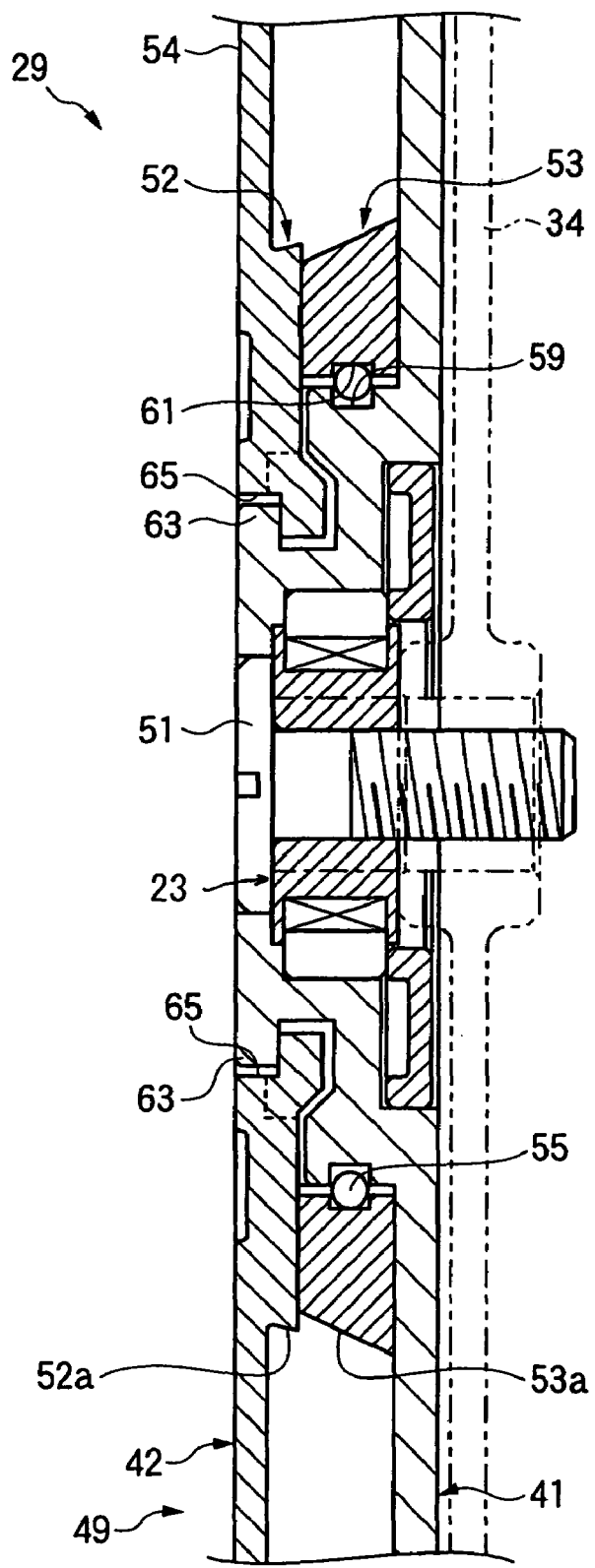
FIG. 8 is a sectional view of a reel member shown in FIG. 7.
Figure 9:
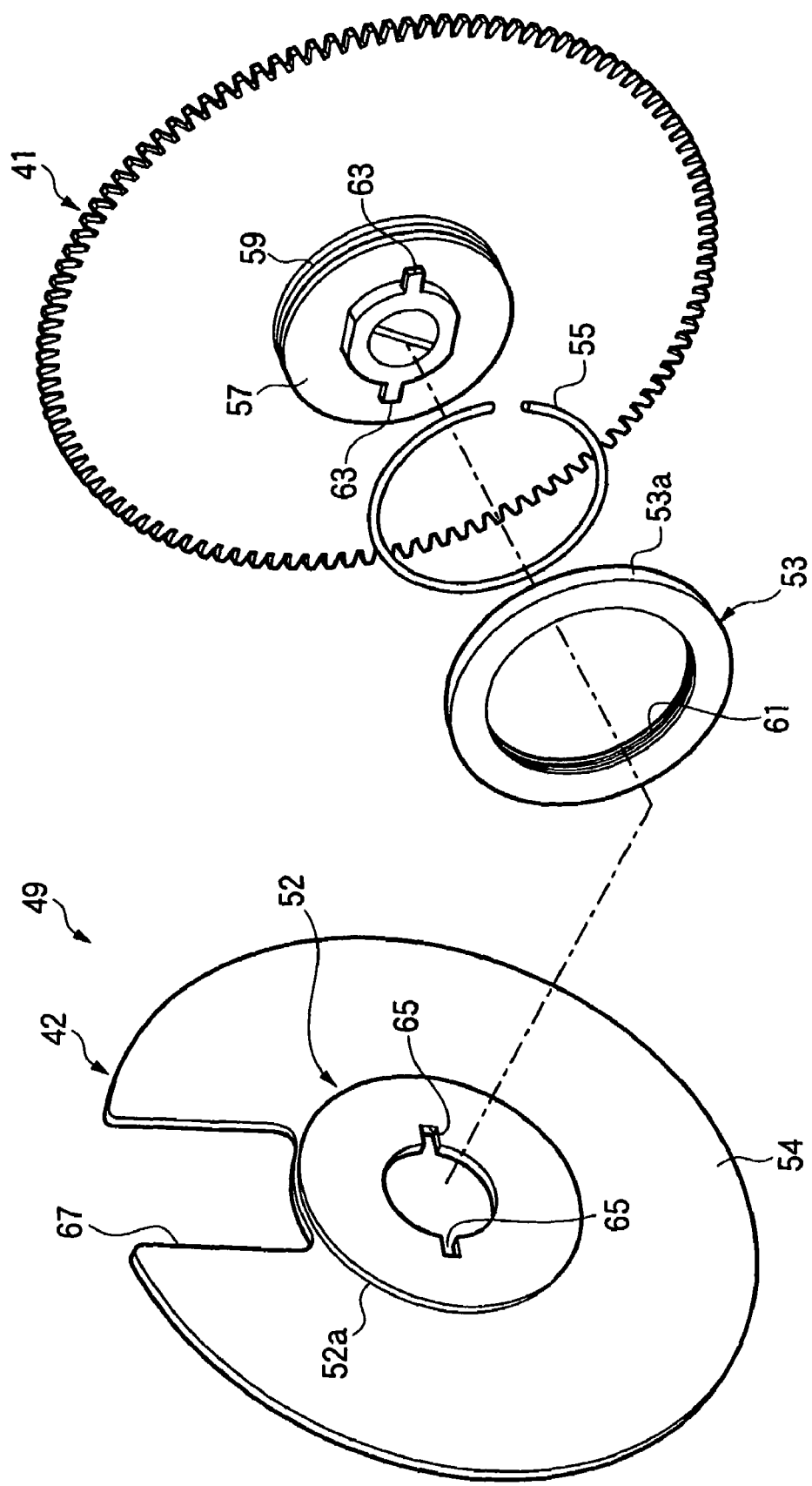
FIG. 9 is an exploded perspective view of the reel member shown in FIG. 8.
Figure 10:
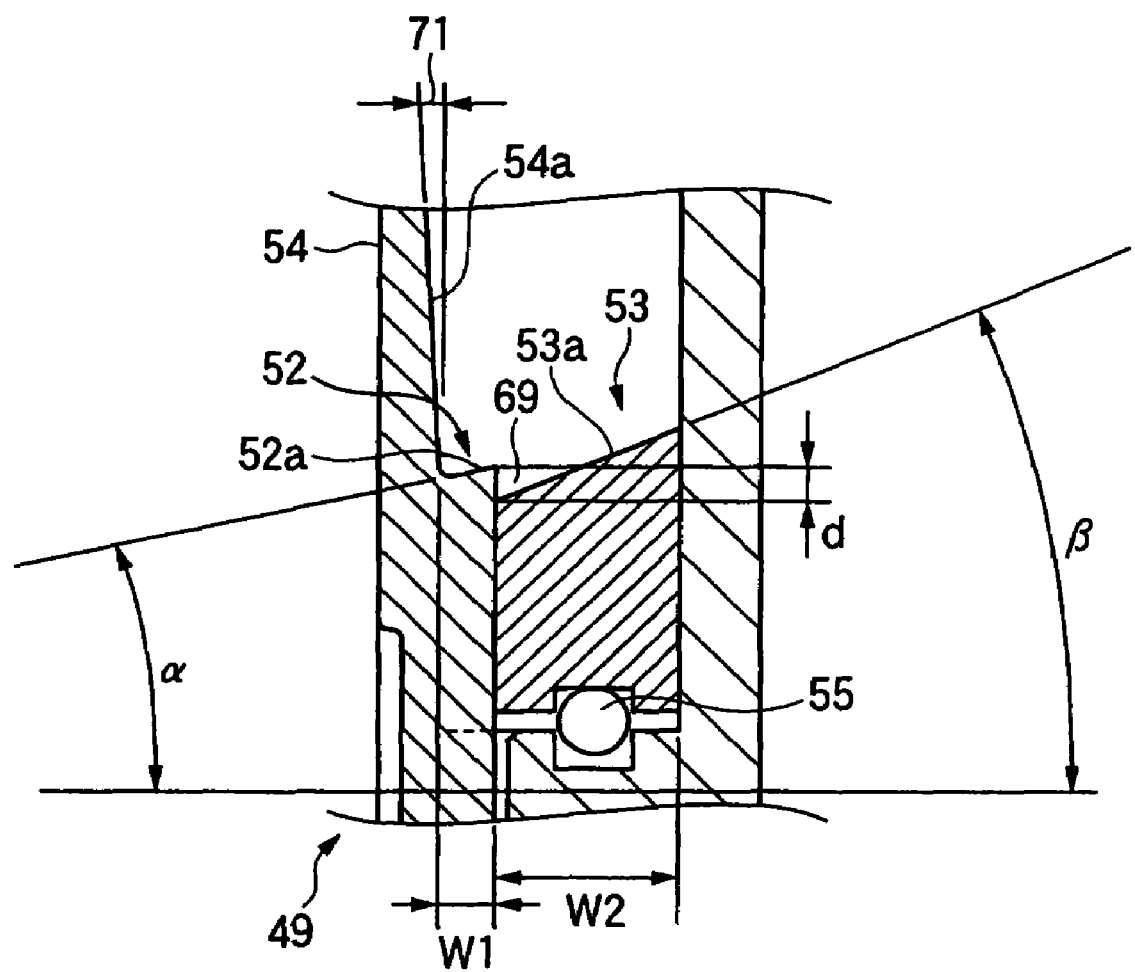
FIG. 10 is an explanatory view showing shape dimensions of respective parts of the reel member.
Figure 11:
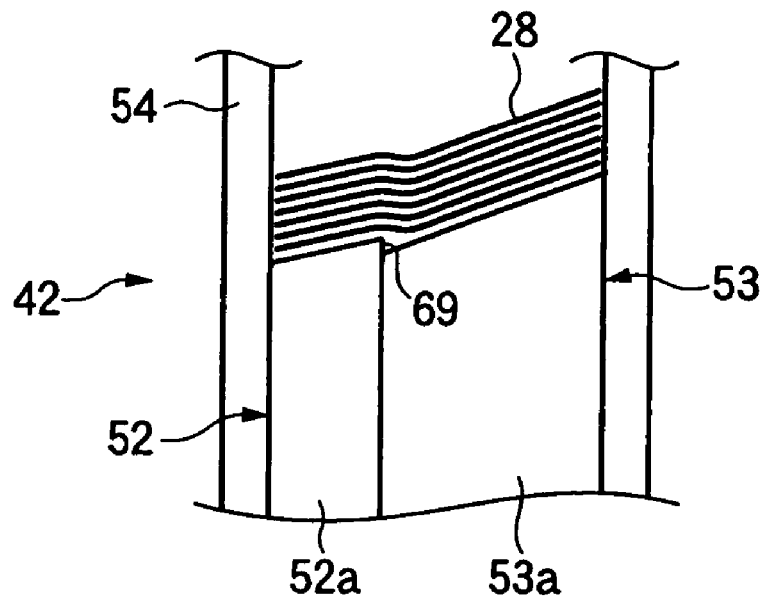
FIG. 11 is an explanatory view showing a top tape rolled state (a) and a separated state (b) of the reel member round which the top tape is rolled.
Figure 11:
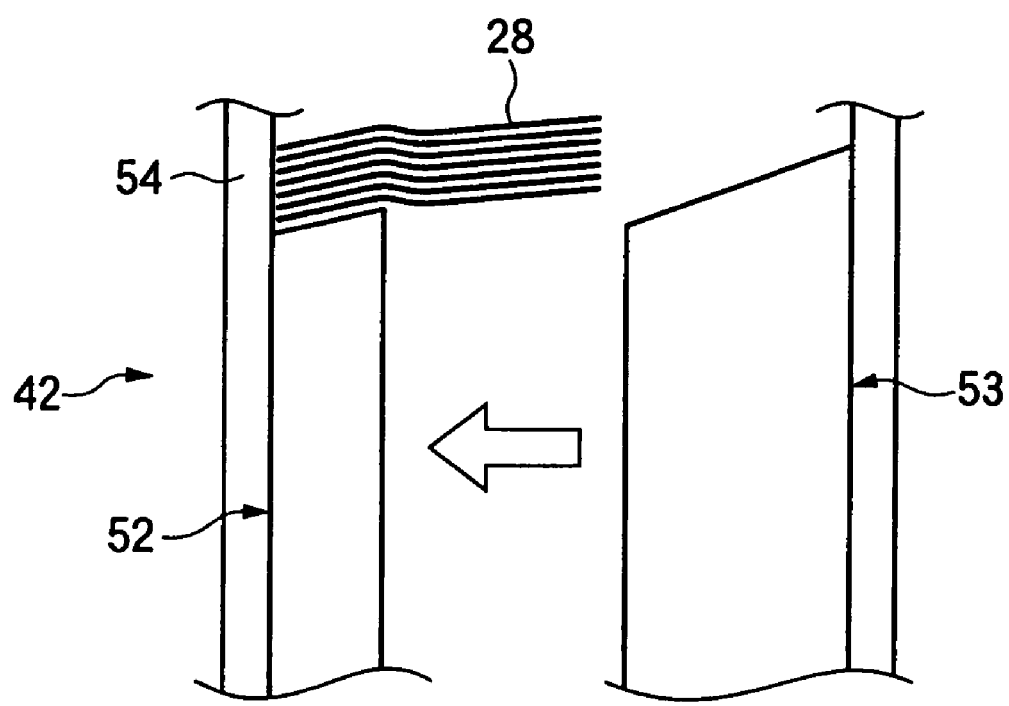
Figure 12:
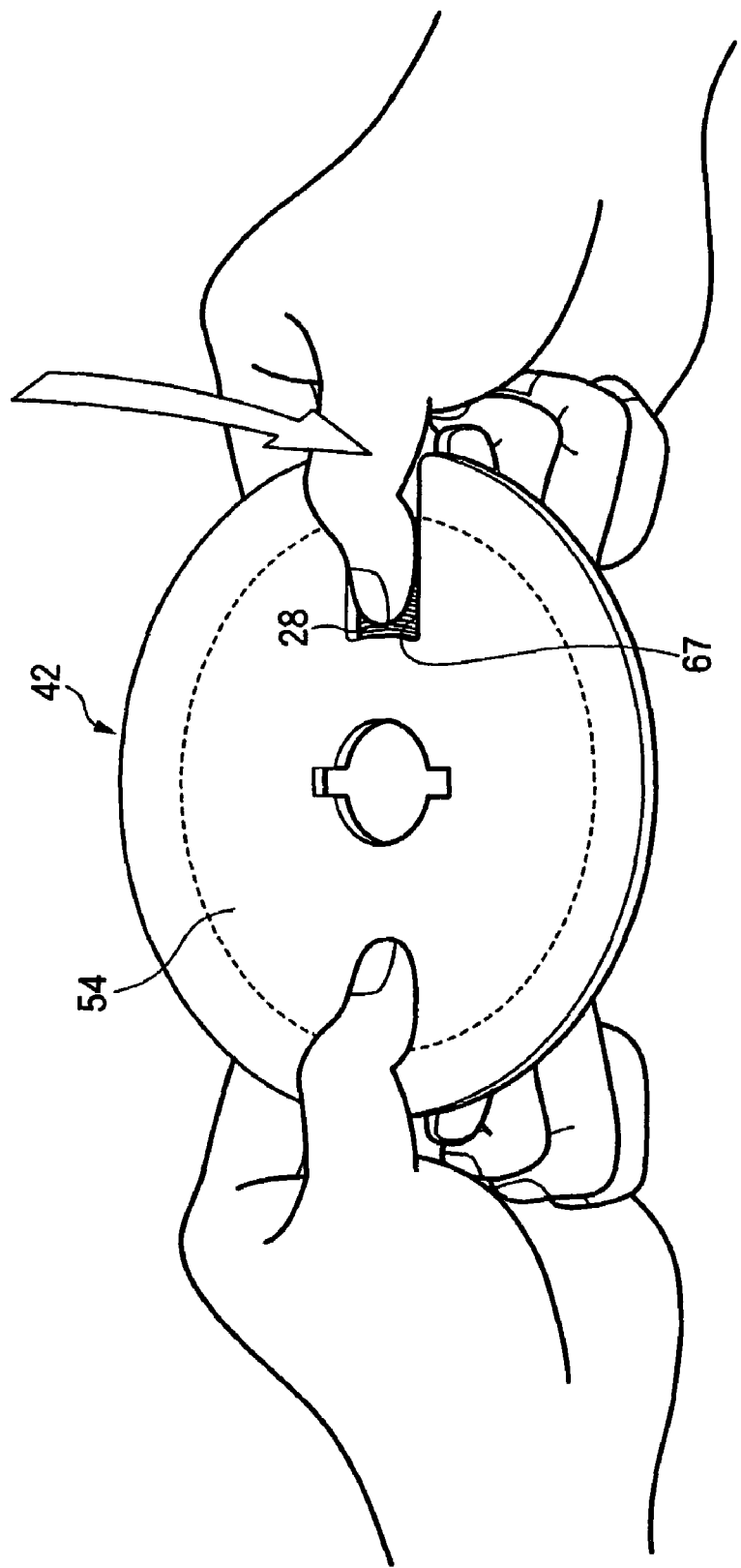
FIG. 12 is an explanatory view of an operation of removing the top tape from a separated winding drum round which the top tape is rolled.
Figure 13:
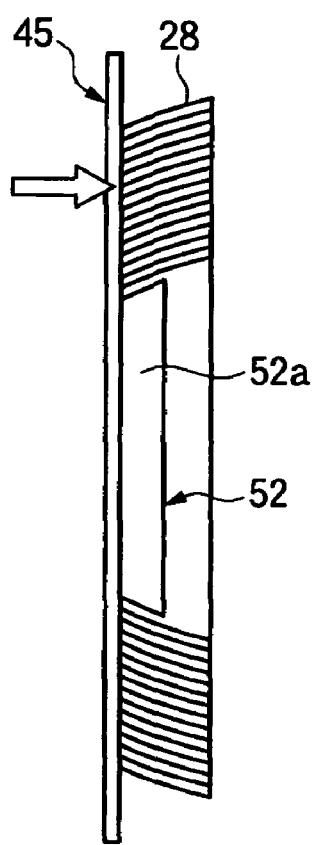
FIG. 13 is an explanatory view showing the operation taken when the top tape is removed from the winding drum, stepwise in (a), (b), and (c).
Figure 13:
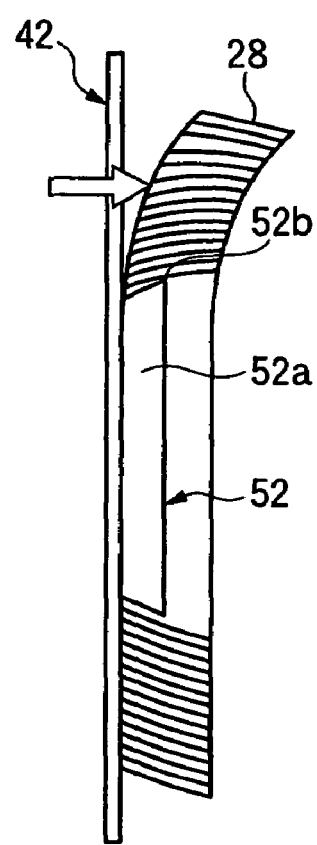
Figure 13:
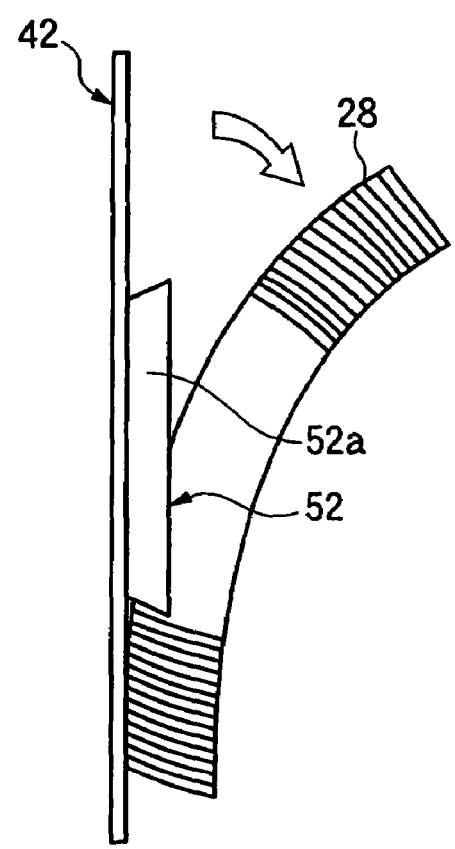

FIG. 7 is a perspective view of the parts supplying system in the second embodiment of the present invention. FIG. 8 is a sectional view of a reel member shown in FIG. 7. FIG. 9 is an exploded perspective view of the reel member shown in FIG. 8. FIG. 10 is an explanatory view showing shape dimensions of respective parts of the reel member. FIG. 11 is an explanatory view showing a separated situation of the reel member round which the top tape is rolled. FIG. 12 is an explanatory view of an operation of removing the top tape from a separated winding drum round which the top tape is rolled. FIG. 13 is an explanatory view showing the operation taken when the top tape is removed from the winding drum.

A parts supplying system 24 according to the present embodiment is applied to the electronic parts packaging machine (not shown) used to package the electronic parts on the printed board, or the like. The parts supplying system 24 is equipped with the packaging machine as many as the number of types of the electronic parts that are required in the packaging machine and the parts supplying system 24 holds the electronic parts of the necessary type at that time is moved to the position opposing to the packaging machine. Then, the electronic parts supplied to the parts supplying position is sucked by a suction nozzle provided to a parts mounting head of the packaging machine and then packaged on the printed board, or the like.

The parts supplying system 24 consists roughly of a main body 25 having a parts supplying portion for receiving a command (pressing operation) issued from the electronic parts packaging machine side to supply the electronic parts, and a parts reel holding portion 26 connected to the main body 25 to hold the reel round which the taped-components are rolled. A carrier tape 27 wound/held on the parts reel holding portion 26 contains the electronic parts in the housing portions (not shown) formed at a predetermined pitch in the longitudinal direction, and its upper surface is covered with a top tape 28.

Also, the main body 25 consists of a top-tape winding portion 29, a parts supplying portion 30, and a driving force transmitting portion 33 for driving the top-tape winding portion 29 and the parts supplying portion 30 respectively and having partially the duplicate constituent elements with them.

The top-tape winding portion 29 is constructed by a feed lever 36 fixed to a frame 34 and turned on a fulcrum shaft 35 by the pressing operation from the electronic parts packaging machine; a winding lever 38 formed like an almost V-shape turned on the fulcrum shaft 35, having a projected portion 38a inserted into an opening portion 36a of the feed lever 36 on one end side, and turned when the projected portion 38a comes into contact with an inner wall surface of the opening portion 36a with the turn of the feed lever 36; a gear arm 39 fitted to a strut (not shown) formed on the other side of the winding lever 38 via an energizing spring (not shown); a hoisting gear 40 having a one-way clutch supported to a strut (not shown) at the top end of the gear arm 39; and a winding reel 41 fitted to the main body 25 side via a one-way clutch 23 (see FIG. 8) that is allowed to turn only in the winding direction and having a tooth-shaped peripheral surface.

The hoisting gear 40 engages with the teeth on the peripheral surface of the winding reel 41, and is allowed to turn only in the opposite direction to the rotatable direction of the winding reel 41. That is, the hoisting gear 40 is allowed to turn only in the winding direction of the winding reel 41 in a state that the hoisting gear 40 engages with the winding reel 41. A winding cap 42 is fitted to the winding reel 41 to face to this winding reel 41 such that the top tape 28 is wound by the winding reel 41 and the winding cap 42.

Then, a pushed surface 36b of the feed lever 36 is always energized by a feed spring 43 upwardly in FIG. 7, the winding lever 38 is always energized by a winding spring 44 fixed to the frame 34 side upwardly in FIG. 7, and the gear arm 39 causes an energizing spring (not shown) to push the hoisting gear 40 against the peripheral surface of the winding reel 41. In addition, tension rollers 45, 46 for suspending the top tape 28 are provided rotatably to the frame 34, and a charge roller 47 is provided rotatably to the end-portion of the feed lever 36. The top tape 28 is released from the carrier tape 27, then put on the tension rollers 45, 46, then wound onto the winding reel 41, and then pulled upward in FIG. 7 by the charge roller 47 between the tension rollers 45, 46.

In the top-tape winding portion 29 constructed as above, the pushed surface 36b at the top end of the feed lever 36 receives the pressing operation from the electronic parts packaging machine in an initial state that the feed lever 36 is not pushed down, and the feed lever 36 is swung. Then, when the feed lever 36 is swung, the winding lever 38 is turned by the tensile force of the winding spring 44 such that the projected portion 38a moves along the inner wall of the opening portion 36a of the feed lever 36. Then, the winding reel 41 is turned in the winding direction in a state that the rotation of the hoisting gear 40 fitted to the top end of the gear arm 39 is stopped.

Then, when the feed lever 36 is returned to its initial state by the elasticity of the feed spring 43 after the pressing operation is released, the projected portion 38a of the winding lever 38 comes into contact with the inner wall surface of the opening portion 36a of the feed lever 36, and then the winding lever 38 is pulled back. Then, the hoisting gear 40 engages with the teeth of the winding reel 41 while rotating, and is returned to the position in the initial state. At this time, since the rotation of the winding reel 41 in the opposite direction to the winding direction is blocked by the one-way clutch 23, the winding reel 41 is stopped without rotation in a state that the top tape 28 is wound on the winding reel 41.

The parts supplying portion 30 has a shutter (not shown) supported slidably, and the shutter receives a force from the above driving force transmitting portion 33 to execute the sliding operation. Also, the shutter has a slit 48 and is formed to open narrowly an upper surface of the housing portion in the carrier tape 27 and open widely an upper surface on both end sides of the top tape in the width direction. The releasing of the top tape 28 by the shutter is executed by a guiding portion (not shown) that pushes the upper surface of the carrier tape 27.

Next, the top-tape winding portion 29 will be explained hereunder. As shown in FIG. 9, in the present embodiment, the top tape 28 released from the carrier tape 27 is wound on the winding cap 42. The winding reel 41 is fixed to a driving shaft 51 shown in FIG. 8. The winding cap 42 is detachably attached to the driving shaft 51 via the winding reel 41, as described later.

The winding cap 42 has a winding drum 52, and the winding reel 41 has a winding drum 53. Winding surfaces 52a, 53a are formed on outer peripheral surfaces of the winding drums 52, 53 respectively. The winding drums 52, 53 are divided in two along the axial direction. A guide flange 54 is formed on one end face of the winding drum 52 as "one winding drum". The winding drum 53 as "the other winding drum" is formed like a tapered ring. A peripheral groove 59 is formed on the outer periphery of a shaft portion 57 of the winding reel 41, and a fitting ring 55 is fitted into the peripheral groove 59. The winding drum 53 has an inner peripheral groove 61 on the inner side, and the winding drum 53 is fitted onto the shaft portion 57 by fitting the fitting ring 55 into the inner peripheral groove 61. The winding drum 53 is rotated but not removed in the axial direction. That is, only the winding cap 42 (one winding drum 52) is detachably attached to the driving shaft. The winding cap 42 and the winding drum 53 constitute a reel member 49.

A pair of engaging wing portions 63, 63 that are projected in the radial direction to float from the end face of the shaft portion 57 are provided to the center of the shaft portion 57. Also, a pair of engaging groove 65, 65 that are notched on the outside in the radial direction are formed in the center of the winding drum 52. The winding cap 42 is fitted removably to the winding reel 41 by inserting the engaging wing portions 63, 63 into the engaging groove 65, 65 and then rotating relatively to the winding reel 41. The top tape 28 is wound on the winding drums 52, 53 fitted to the winding reel 41 in this manner to spread over the winding surfaces 52a, 53a of both drums.

An opening portion 67 is provided to the guide flange 54. The opening portion 67 can be formed as the notch that is notched in a dimension that reaches the outer peripheral surface of the winding drum 52 from the top end of the guide flange 54 in the radial direction, for example. The opening portion 67 permits the finger being inserted into the portion to push the side surface of the top tape 28 being wound on the winding drum 52, as described later.

Also, as shown in FIG. 10, a pair of winding drums 52, 53 have the tapered winding surfaces 52a, 53a whose outer diameter is increased larger in the direction that goes away from the guide flange 54. Then, the outer diameter of the other winding drum 53 opposing to the other end face of one winding drum 52 is formed smaller than an outer diameter of the other end face of one winding drum 52. As a result, as shown in FIG. 10, a level difference 69 is formed at the boundary portion between the winding drums 52, 53.

Here, as shown in FIG. 10, a taper angle $\alpha$ (for example, almost 7°) of the winding drum 52 is set smaller than a taper angle $\beta$ (for example, almost 17°) of the winding drum 53. Also, it is preferable that a height d of the level difference 69 between should be set to about 0.5 to 2 mm. In addition, it is preferable that a thickness W1 of the winding drum 52 should be set to about ⅓ of the width of the top tape 28 and a thickness W2 of the winding drum 53 should be set to about ⅔ of the width of the top tape 28. In this case, the width of the top tape 28 is smaller than the width of the carrier tape 27 and is set to about 5.5 mm, for example, when the width of the carrier tape 27 is 8 mm.

In this fashion, as shown in FIG. 11(a), since a pair of winding drums 52, 53 on which the top tape 28 is wound can be separated by forming the level difference 69 at the boundary portion between the winding drums 52, 53, not only both winding drums can be separated in the situation that the top tape 28 is put on one winding drum 52 and held thereon but also a contact friction between the other winding drum 53 and the top tape 28 can be reduced by the level difference 69 and the tapered surfaces and a separating force can be reduced.

Also, as shown in FIG. 10, an inner side face 54a of the guide flange 54 is formed as an inclined surface having an inclination 71 that reduces a thickness of the guide flange 54 toward the outside of the guide flange 54 in the radial direction. Therefore, the top tape 28 that is to be wound on the winding surface 52a of the winding drum 52 is guided to the guide flange 54 side and thus the top tape 28 can be wound stably on the winding surface 52a along the guide flange 54 side. As a result, the attaching/detaching operation of the winding surface 52a can be facilitated and also a rotating resistance of the winding ratchet can be reduced.

In order to remove the top tape 28 from the reel member 49 constructed as above, as shown in FIG. 11(b), first the winding drum 52 is removed in the situation that the top tape 28 is wound on the winding cap 42, while leaving only the winding drum 53 on the winding reel 41 side.

Then, as shown in FIG. 12, the force is applied to the side surface of the top tape 28 by inserting the finger into the opening portion 67 of the guide flange 54. Thus, the top tape 28 can be removed at a time from the winding drum 52 in the axial direction.

At that time, as shown in FIG. 13(a), because the top tape 28 is protruded from the winding drum 52 by almost ⅔ in the width direction, the force can be applied effectively by pushing the top tape 28 via the opening portion 67 to crash it, as shown in FIG. 13(b). In other words, the large releasing force can be applied to the inner peripheral winding surface owing to the action of levers while using an edge portion 52b of the winding drum 52 as the supporting point. Consequently, as shown in FIG. 13(c), easy removal of the top tape from the concerned portion can be attained.

According to this reel member 49, the top tape 28 is wound on a pair of winding drums 52, 53 to spread over the winding surfaces 52a, 53a respectively. That is, one end side of the top tape 28 in the width direction is wound on one winding drum 52 whereas the other end side in the width direction is wound on the other winding drum 53. Therefore, the top tape 28 is still wound only on one winding drum 52 by separating a pair of winding drums 52, 53 on which the top tape 28 is wound. As a result, the contact friction between the top tape and the winding surfaces 52a, 53a can be reduced largely and thus removal of the top tape 28 from the winding drum 52 can be made easy.

Also, because the opening portion 67 through which the side surface of the top tape 28 can be pushed is provided in the guide flange 54, the top tape 28 wound on the winding drum 52 can be removed by pushing directly the tape by the finger. Thus, the ring as the separated member can be omitted and the inoperable state of the parts supplying system because of loss of the ring is not caused. In addition, there is no necessity to remove the ring by using the jig and thus time and labor required for the jig operation is not needed. Further, the ring and the jig are not needed, the cost of equipment of them is not generated.

Also, according to the above method of removing the rolled top tape, the top tape 28 can be removed collectively from the winding drum 52 in the axial direction by detaching the winding cap 42 and then applying the force to the side surface of the top tape 28 via the opening portion 67 of the guide flange 54. Also, because the pushing force of the finger can be applied directly to the side surface of the top tape 28 that is wound tightly and densely on the winding drum 52, removal of the top tape 28 from the winding cap 42 can executed easily and quickly without fail.

According to the parts supplying system 24 having such reel member 49, the top tape 28 that is wound on the reel member 49 can be removed easily and quickly and also attaching/detaching of the reel member 49 to remove the top tape can be executed without trouble. Thus, the supply rate of the electronic parts and the productivity can be improved.

THIRD EMBODIMENT

Next, a third embodiment of a parts supplying system according to the present invention will be explained hereunder.

Figure 14:
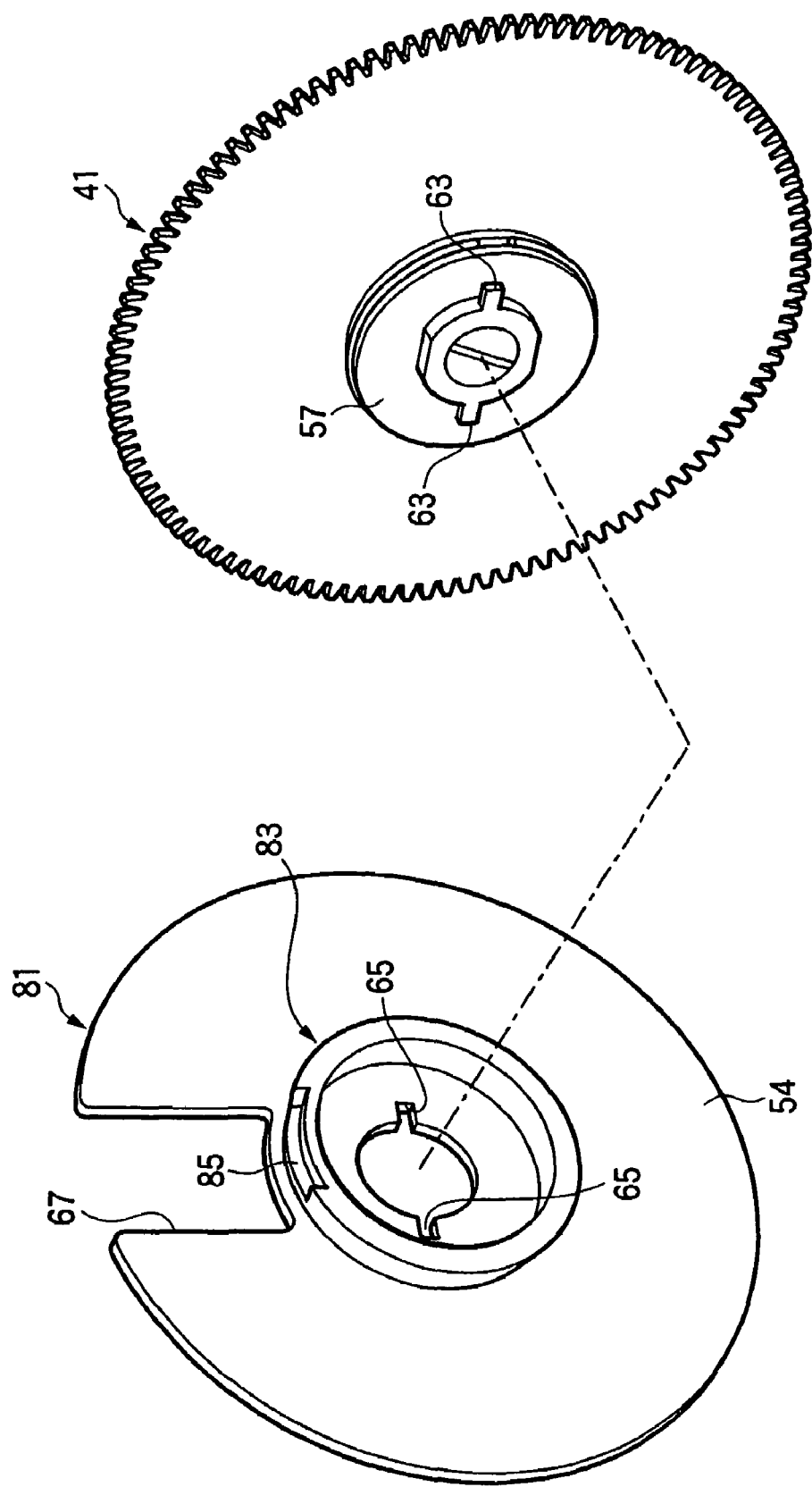
FIG. 14 is a perspective view of the reel member having a recess portion used in a third embodiment of a parts supplying system according to the present invention.
Figure 15:
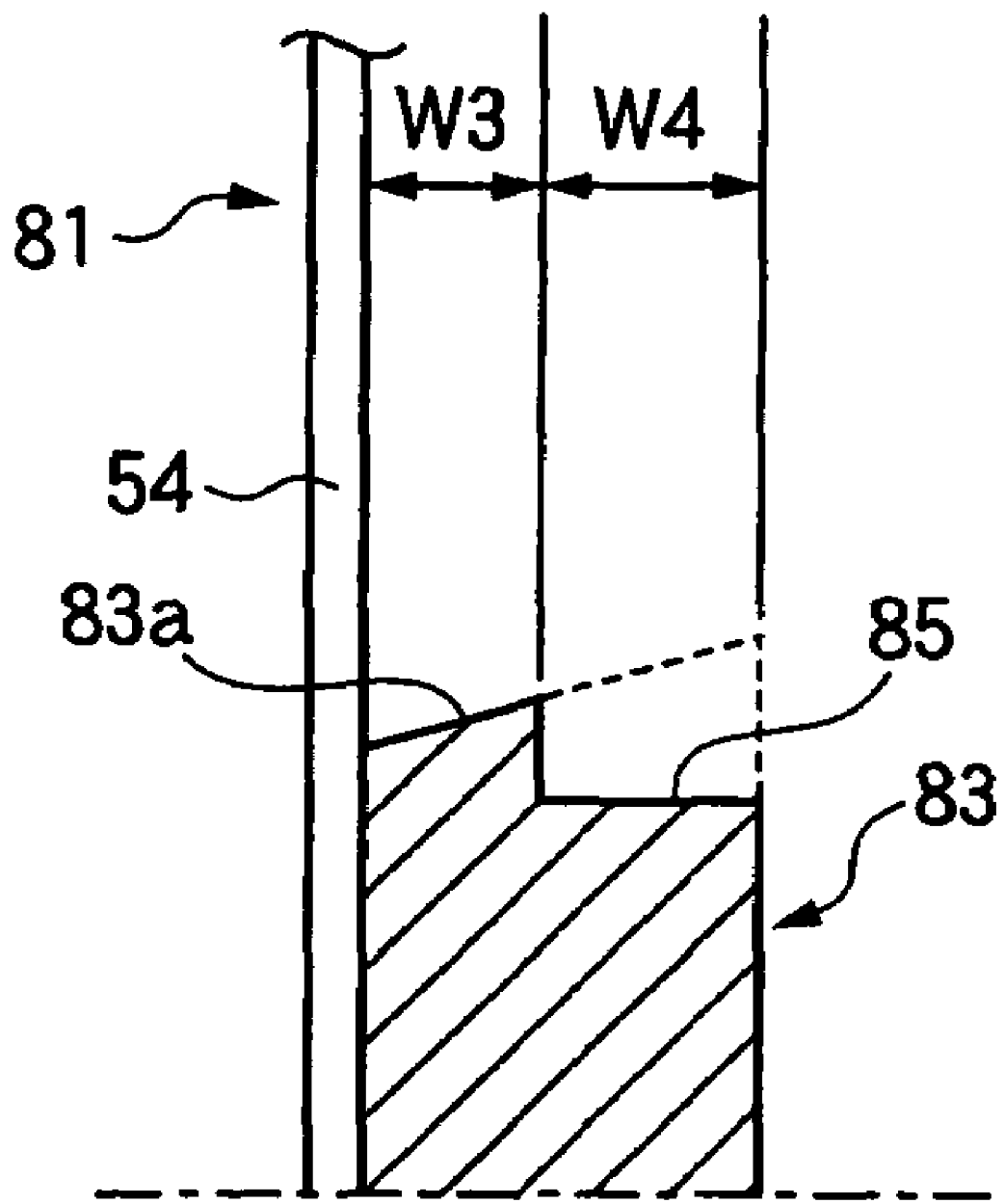
FIG. 15 is an enlarged sectional view of the recess portion shown in FIG. 14.
Figure 16:
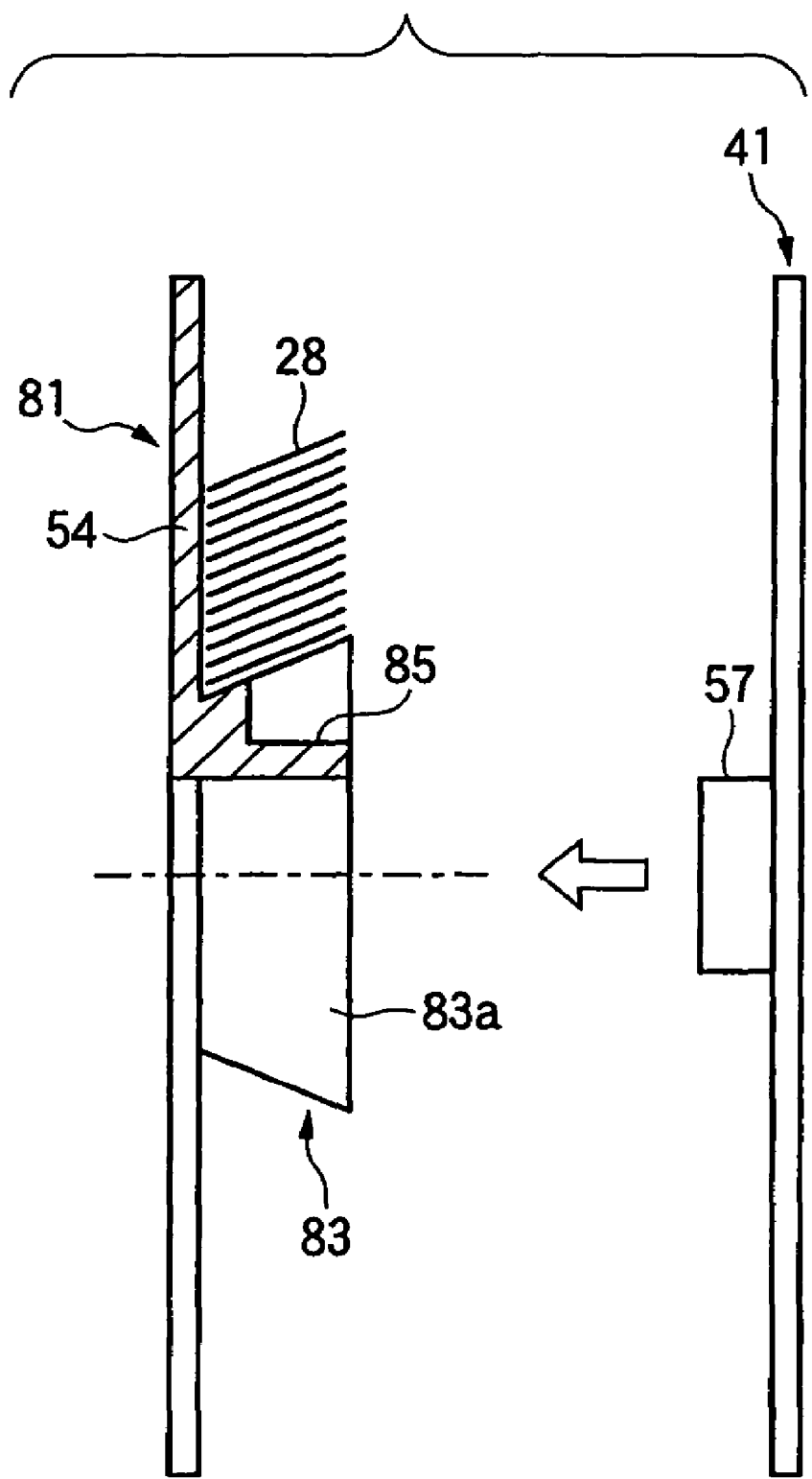
FIG. 16 is a half-sectioned view of the reel member round which the top tape is rolled and shown in FIG. 14.
Figure 17:
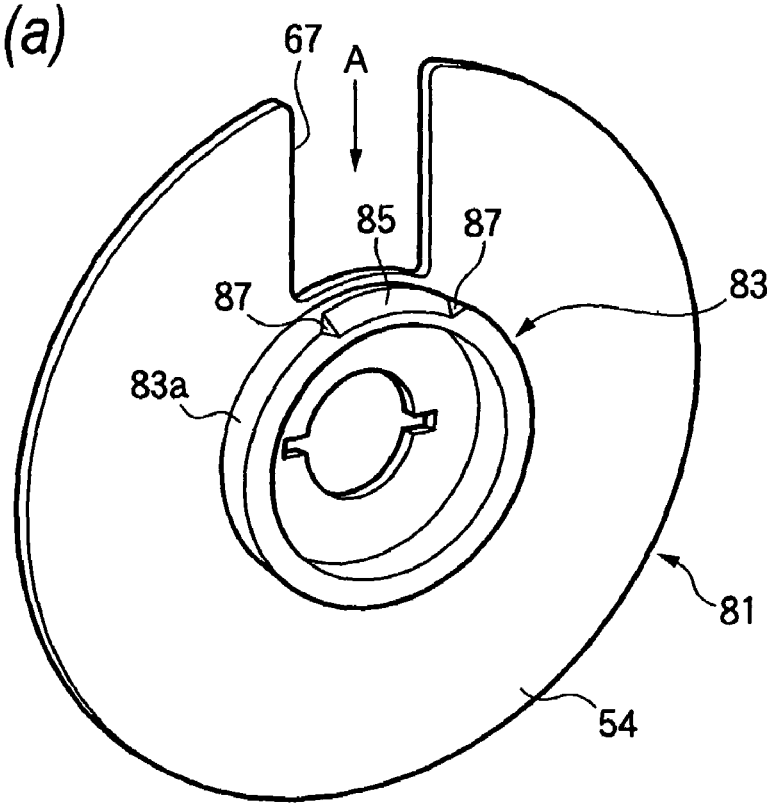
FIG. 17 is an explanatory view showing relative positions of the opening portion of the reel member and the recess portion and a shape of the recess portion, wherein (a) is a perspective view and (b) is a view viewed along the direction A indicated by an arrow.
Figure 17:
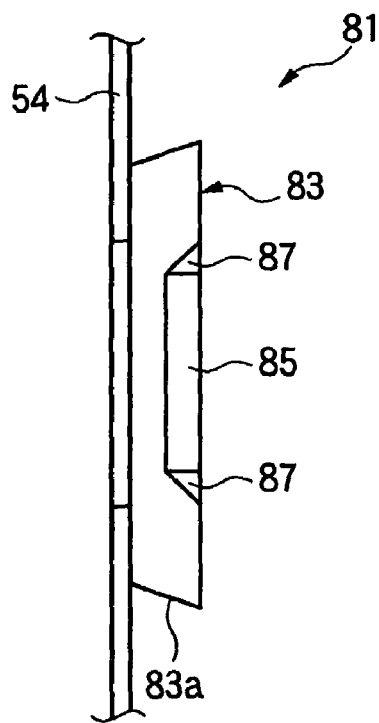
Figure 18:
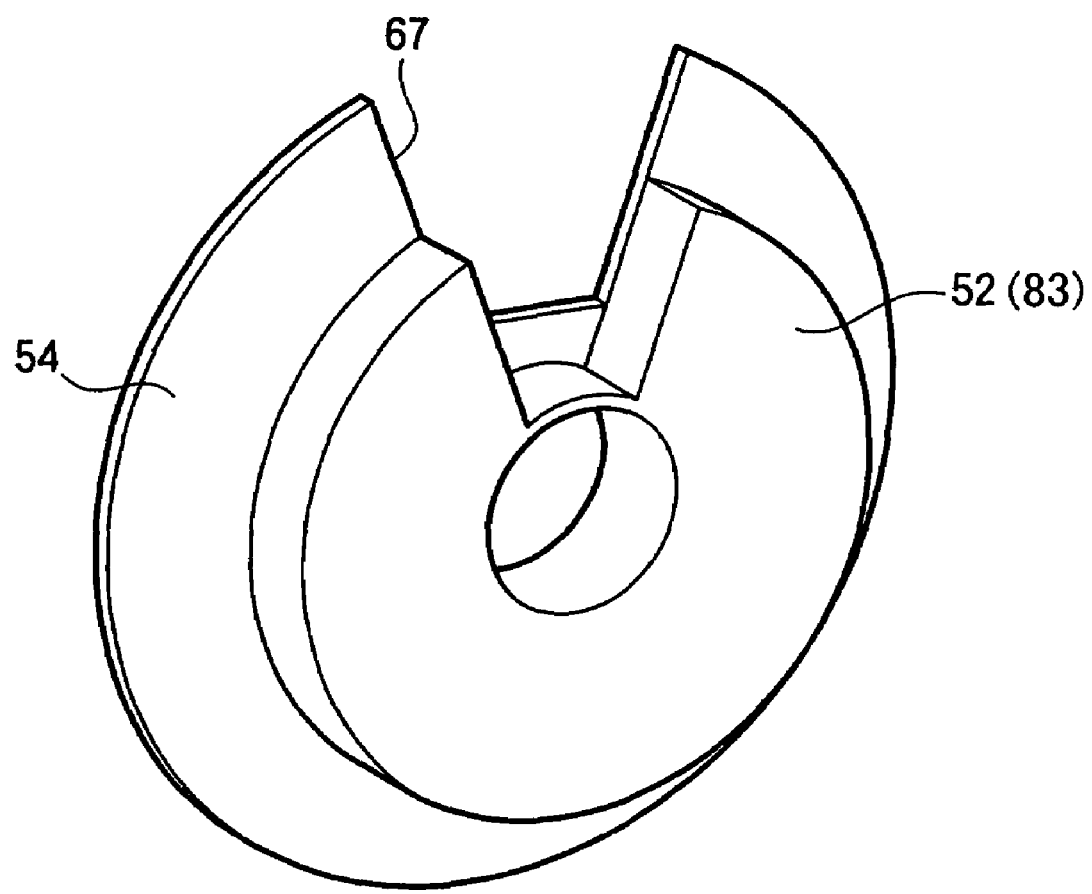
FIG. 18 is a perspective view showing a variation of the reel member having the recess portion.
Figure 19:
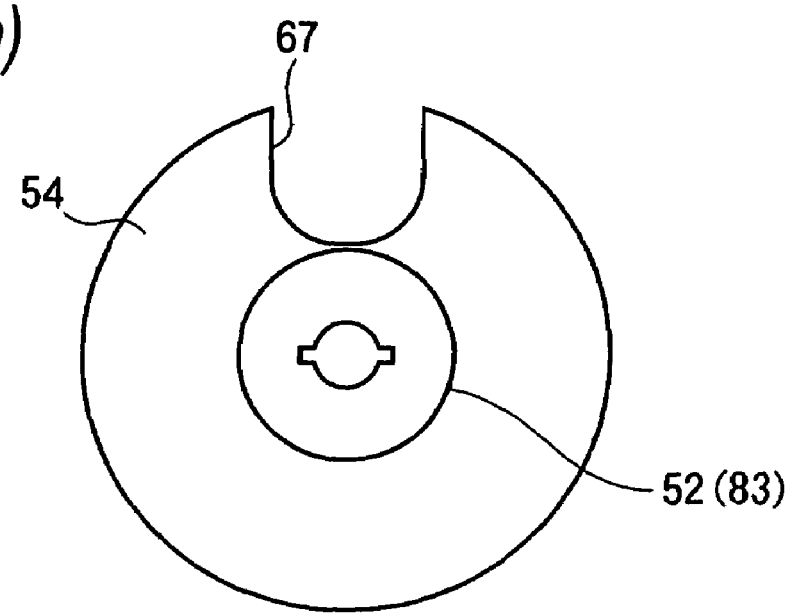
FIG. 19 is an explanatory view showing a variation of the opening portion, wherein (a) is a view showing a U-shaped notch and (b) is a view showing holes in any numbers.
Figure 19:
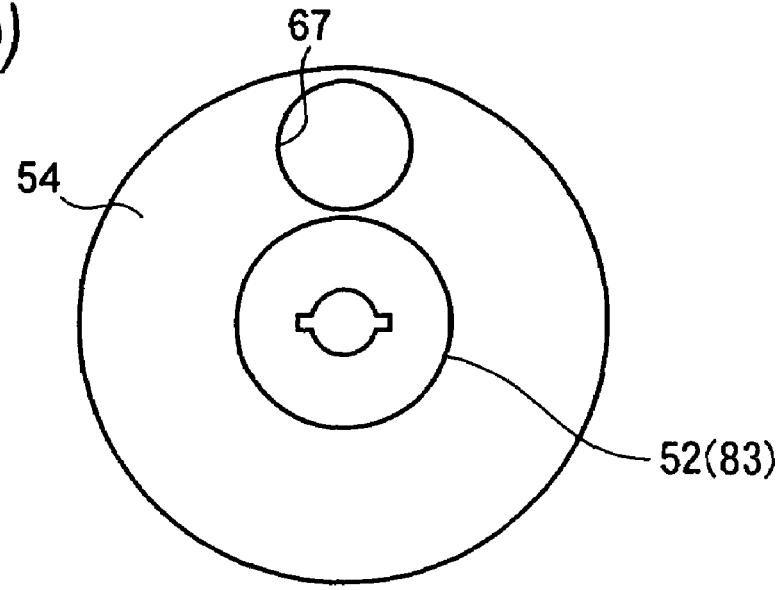

FIG. 14 is a perspective view of the reel member having a recess portion used in a parts supplying system in the third embodiment of the present invention. FIG. 15 is an enlarged sectional view of the recess portion shown in FIG. 14. FIG. 16 is a half-sectioned view of the reel member round which the top tape is rolled and shown in FIG. 14. FIG. 17 is an explanatory view showing relative positions of the opening portion of the reel member and the recess portion and a shape of the recess portion. FIG. 18 is a perspective view showing a variation of the reel member having the recess portion. FIG. 19 is a view showing a variation of the opening portion. In this case, in the following description, the same reference symbols are affixed to the same members as those shown in FIG. 7 to FIG. 13 and their redundant explanation will be omitted herein.

A reel member 81 in this embodiment is detachably attached to the driving shaft 51 via the winding reel 41. Then, a winding drum 83 of the reel member 81 has a recess portion 85, which is hollowed inwardly in the radial direction, in a portion in the circumferential direction. As shown in FIG. 15, when the width of the top tape 28 is 5.5 mm, a height W3 of a portion in which the recess portion 85 is not formed is set to about 3 mm and a height W4 of the recess portion 85 is set to about 2.5 mm. That is, preferably the height W4 of the recess portion 85 should be set in a range of ½ to ¼ of the width of the top tape 28.

Also, in the present embodiment, the winding drum 83 has a tapered winding surface 83a whose outer diameter is increased larger in the direction that goes away from the guide flange 54. Therefore, as shown in FIG. 16, the top tape 28 wound on the winding surface 83a can be rolled stably along the guide flange 54.

Also, as shown in FIG. 17(a)(b), inner wall surfaces 87, 87 opposing to each other at both ends of the recess portion 85 in the circumferential direction are formed as a taper surface that is expanded toward the outside in the radial direction. Therefore, a corner portion (edge portion) at which the inner wall surface 87 and the winding surface 83a forms an obtuse angle, and thus the sticking in removing the top tape due to the event that the edge portion bites into the inner peripheral surface side of the top tape 28 can be reduced. That is, the top tape 28 can be removed more easily.

Then, as shown in FIG. 17(a), the opening portion 67 provided in the guide flange 54 and the recess portion 85 are arranged on a straight line in the radial direction of the guide flange 54. Therefore, the pushing force can be applied to the side surface of the wound top tape 28 on the recess portion 85 via the opening portion 67, and thus the pushing force in removing the top tape 28 from the recess portion 85 can be applied effectively to the side surface of the top tape near the recess portion 85.

According to the reel member 81 constructed as above, the top tape 28 wound on the winding surface 83a of the winding drum 83 does not contact to the winding surface 83a in the recess portion 85 and can be deformed in the depth direction of the recess portion 85. In other words, the wound top tape 28 is ready to be removed from the winding surface 83a if the top tape 28 is deformed (crashed) in the direction along which such top tape is pushed into the recess portion 85. In this manner, if a part of the wound top tape 28 in the circumferential direction is removed in the recess portion 85, a winding/clamping force generated by winding the tape on the whole circumference of the winding surface 83a disappears, and thus the wound top tape 28 is ready to be removed collectively from the winding drum 83.

In this case, in the above embodiment, the case where the opening portion 67 is cut merely into the position that reaches the outer peripheral surfaces of the winding drum 52, the winding drum 83 is explained as an example. As shown in FIG. 18, the opening portion 67 may be cut to reach the winding drum 52 (or the winding drum 83). If the opening portion 67 having such deep cutting is formed, the pushing force can be applied surely to the boundary surface between the winding drum 52, the winding drum 83 and the top tape 28 and thus the releasability of the top tape 28 can be improved.

Also, in the above embodiment, the case where the opening portion 67 is formed as the rectangular notch is explained as an example. In addition, the opening portion 67 may be formed as a U-shaped notch, as shown in FIG. 19(a), or the opening portion 67 may be formed as holes in any numbers, as shown in FIG. 19(b).

FOURTH EMBODIMENT

Next, a fourth embodiment of a parts supplying system according to the present invention will be explained hereunder.

Figure 20:
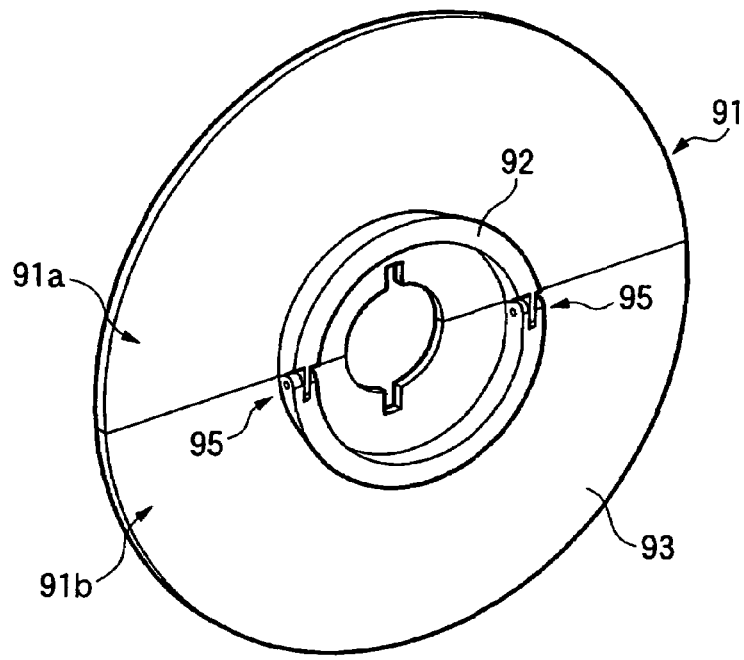
FIG. 20 is an explanatory view of the reel member used in a fourth embodiment of a parts supplying system according to the present invention, wherein (a) is a perspective view of the reel member formed foldably and (b) is an enlarged exploded view of the pertinent portion in (a).
Figure 20:
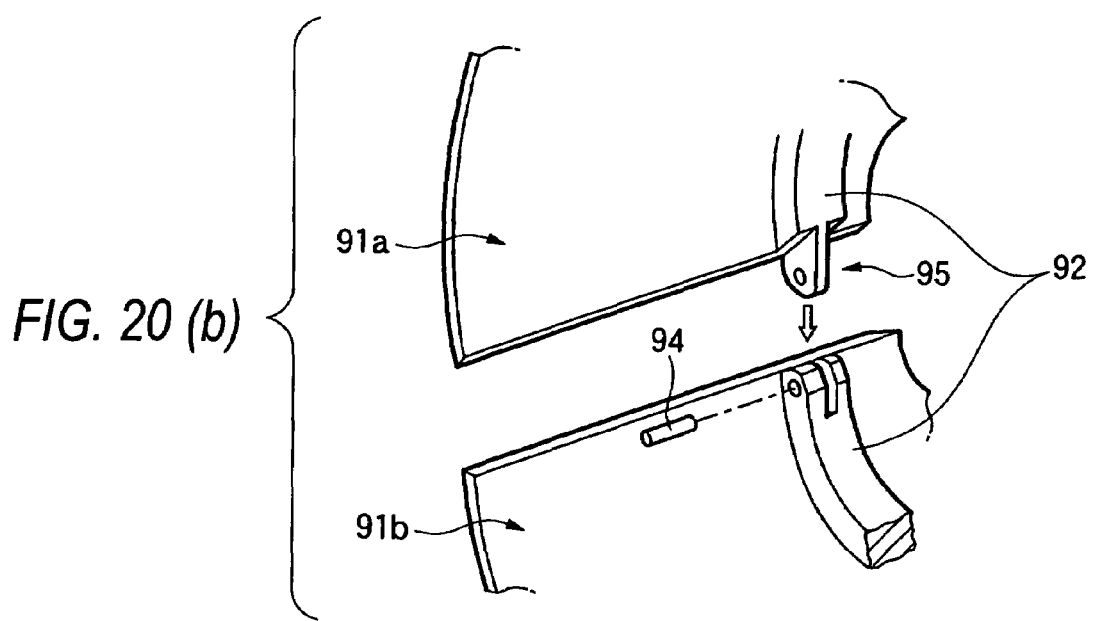
Figure 21:
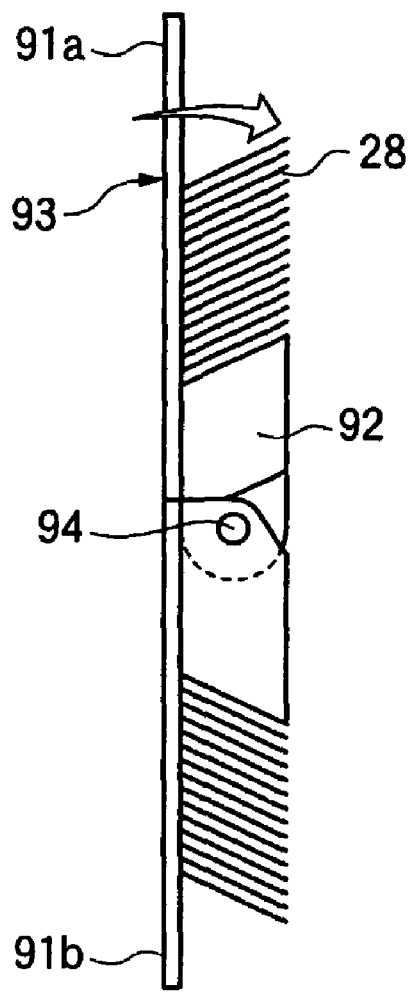
FIG. 21 is an explanatory view of an operation of the reel member shown in FIG. 20, wherein (a) is a sectional view showing a state that the top tape is rolled round the reel member and (b) is a sectional view showing a state that the reel member is folded.
Figure 21:
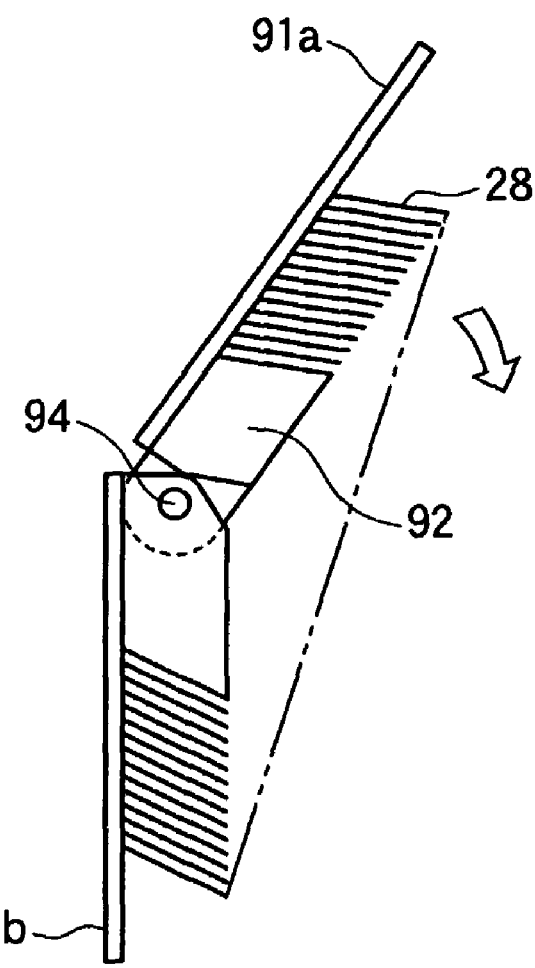
Figure 22:
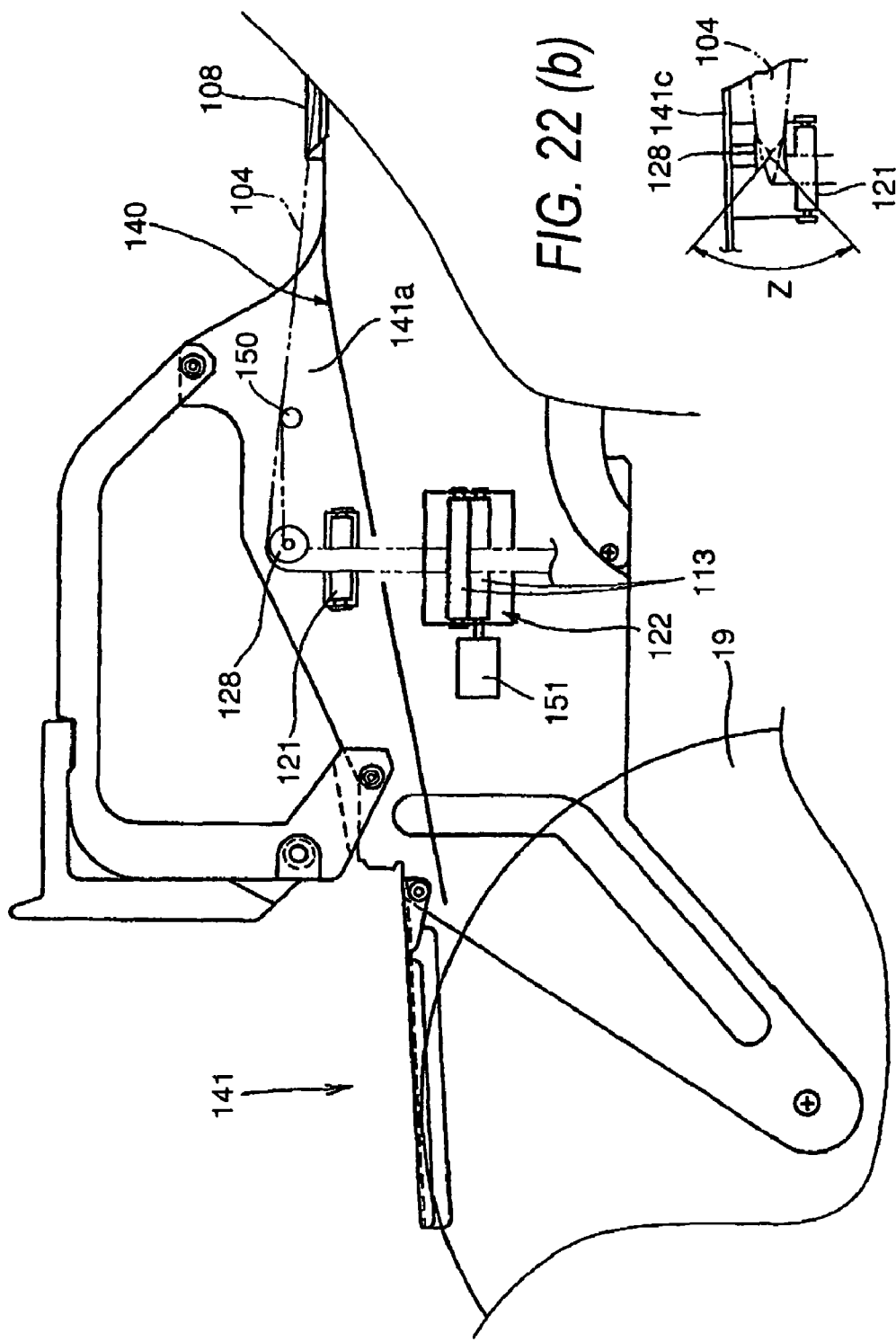
FIG. 22 is an explanatory view of a pertinent portion, wherein (a) is a front view showing a pertinent portion of the parts supplying system in the prior art and (b) is a plan view showing a pertinent portion of the portion.
Figure 23:
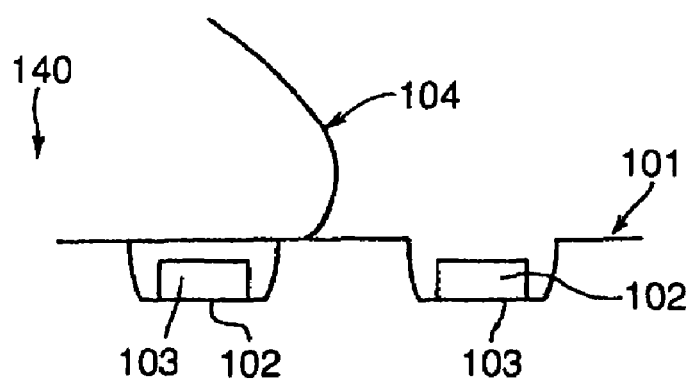
FIG. 23 is an explanatory view of the pertinent portion, wherein (a) is a front view showing the normal taped-components and (b) is a plan view showing the components.
Figure 23:
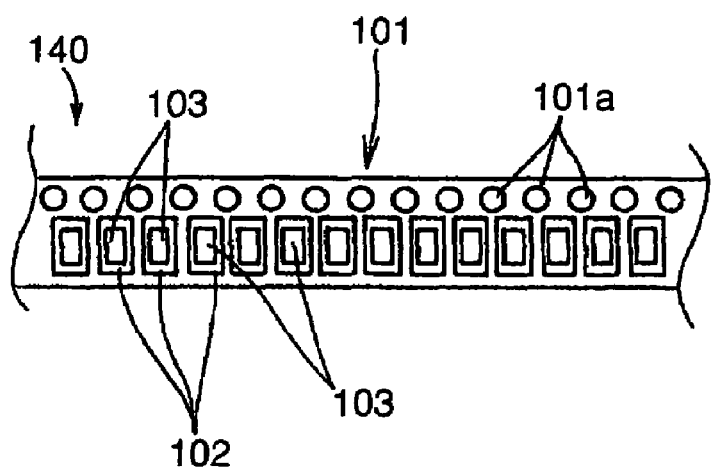

FIG. 20(a) is a perspective view of the reel member in which the guide flange and the winding drum can be formed foldably and FIG. 20(b) is an enlarged exploded view of the pertinent portion in (a). FIG. 21 is an explanatory view of an operation of the reel member shown in FIG. 20, wherein (a) is a sectional view showing a state that the top tape is rolled round the reel member and (b) is a sectional view showing a state that the reel member is folded.

A reel member 91 in the present embodiment is detachably attached to the driving shaft 51 via the winding reel 41. Then, as shown in FIG. 20(a), a winding drum 92 and a guide flange 93 of the reel member 91 are formed to be split in the diameter direction respectively and the reel member 91 is separated into reel-member half pieces 91a, 91b. As shown in FIG. 20(b), the reel-member half pieces 91a, 91b are coupled mutually by hinge portions 95 each formed at the end portion of the winding drum 92. In other words, the reel-member half pieces 91a, 91b are hinged together at the end portions of the winding drum 92 in such a manner that they can be folded like a "<"-shape in which a pin 94 is positioned at its center, the winding drum 92 is positioned on the inside, and the guide flange 93 is positioned on the outside.

When the top tape 28 is wound after the reel member 91 is fitted to the winding reel 41 on the parts supplying system side, a state shown in FIG. 21 (a) is brought about. Then, when the guide flange 93 is bent from this state in the direction indicated by an arrow in FIG. 21(a), the reel member 91 is bent like the "<"-shape from the pin 94 in the almost center position, as shown in FIG. 21(b). Thus, the wound top tape 28 can be removed from the winding drum 92.

According to the reel member 91 constructed in this manner, the removing operation of the top tape 28 being wound on the winding drum 92 can be executed by a simple working to bend simply the reel member 91.

INDUSTRIAL APPLICABILITY

In the parts supplying system of the present invention represented by the first embodiment, the top tape carrying portion includes a tape lifting portion for lifting a predetermined length of the top tape by almost 90 degree to direct respective adhesive faces on both ends inwardly, a tape folding portion for folding the top tape by tilting a lifted top tape toward a not-lifted top tape, and a tape discharging portion for feeding the folded top tape every predetermined pitch. Therefore, since the top tape can be lifted by almost 90 degree to direct respective adhesive faces on both ends inwardly by merely passing the top tape through the top tape carrying portion and also the lifted portion of the top tape is tilted inwardly to come into tight contact with the not-lifted portion, such an advantage can be achieved that the released top tape can be discharged after the adhesive faces are closed without fail.

Also, in the parts supplying system of the present invention represented by the second to fourth embodiments, the method of removing collectively the top tape from the winding drum in the axial direction by detaching the reel member from the driving shaft and then applying the force to the side surface of the top tape through the opening portion of the guide flange can be employed as the method of removing the top tape wound on the reel member. Therefore, the pushing force of the finger can be applied directly to the side surface of the top tape that is wound tightly and densely on the winding drum, and removal of the top tape from the reel member can executed easily and quickly without fail. Thus, attaching/detaching of the reel member to remove the top tape can be executed without trouble and also the supply rate of the electronic parts and the productivity can be improved.

Also, in the parts supplying system according to the present invention, the reel member includes the winding drum detachably attached to the driving shaft, and the guide flange formed on one end face of the winding drum and having the opening portion through which the side surface of the top tape wound on the winding drum is pushed. Therefore, the top tape wound on the winding drum can be removed by pushing directly the tape by the finger. As a result, the ring formed as the separated member is never lost, and time and labor required for the jig operation is not needed since there is no necessity to remove the ring by using the jig, and in addition the cost of equipment of the ring and the jig can be neglected.

Also, in the parts supplying system according to the present invention, the reel member includes a pair of winding drums detachably attached to a driving shaft that rotates/drives the reel member, having a winding surface on respective outer peripheral surfaces, and divided in two in an axial direction, one part being detachably attached to the driving shaft, and a guide flange formed on one end face of one winding drum. Therefore, the top tape wound on the winding drum can be removed by pushing directly the tape by the finger.

Also, in the reel member of the parts supplying system according to the present invention, the winding drum and the guide flange are bent in removing from the driving shaft to position the winding drum on an inner side and the guide flange on an outer side. Therefore, the top tape can be removed by a simple operation of bending the reel member.

The invention claimed is:

1. A parts supplying system capable of taking out an electronic parts from a housing portion by releasing a top tape from a carrier tape, while moving the carrier tape which has the housing portion for the electronic parts and a surface of which is covered with the releasable top tape in a longitudinal direction, to wind on a reel member,
   wherein the reel member includes
   a pair of winding drums detachably attached to a driving shaft that rotates/drives the reel member, having a winding surface on respective outer peripheral surfaces, and divided in two in an axial direction, one part being detachably attached to the driving shaft, and
   a guide flange formed on one end face of one winding drum, whereby the top tape is wound on winding surfaces of the pair of winding drums.

2. The parts supplying system according to claim 1, wherein an inner side surface of the guide flange is formed as an inclined surface that reduces a thickness of the guide flange outwardly in the radial direction of the guide flange.

3. A parts supplying system capable of taking out an electronic parts from a housing portion by releasing a top tape from a carrier tape, while moving the carrier tape which has the housing portion for the electronic parts and a surface of which is covered with the releasable top tape in a longitudinal direction, to wind on a reel member,
   wherein the reel member includes
   a pair of winding drums detachably attached to a driving shaft that rotates/drives the reel member, having a winding surface on respective outer peripheral surfaces, and divided in two in an axial direction, one part being detachably attached to the driving shaft, and
   a guide flange formed on one end face of one winding drum, whereby the top tape is wound on winding surfaces of the pair of winding drums,
   the pair of winding drums have a tapered winding surface whose outer diameter is increased large in a direction that goes away from the guide flange, and
   an outer diameter of an end face of the other winding drum opposing to one end face of one winding drum is smaller than an outer diameter of the other end face of one winding drum.

4. A parts supplying system capable of taking out an electronic parts from a housing portion by releasing a top tape from a carrier tape, while moving the carrier tape which has the housing portion for the electronic parts and a surface of which is covered with the releasable top tape in a longitudinal direction, to wind on a reel member,
   wherein the reel member includes
   a winding drum detachably attached to a driving shaft that rotates/drives the reel member and having a recess portion that is hollowed inwardly in a radial direction in a part of a circumference, and
   a guide flange formed on one end face of the winding drum and having an opening portion,
   wherein the opening portion allows a finger to be inserted to rush a side surface of the top tape wound on the winding drum,
   wherein the inner wall surfaces opposing to each other at both ends of the recess portion in a circumferential direction are formed as a tapered surface that expands outwardly in a radial direction.

* * * * *

UNITED STATES PATENT AND TRADEMARK OFFICE
CERTIFICATE OF CORRECTION

PATENT NO. : 7,464,741 B2  Page 1 of 1
APPLICATION NO. : 10/527668
DATED : December 16, 2008
INVENTOR(S) : Satoshi Kawaguchi et al.

It is certified that error appears in the above-identified patent and that said Letters Patent is hereby corrected as shown below:

In column 5, line 7, please complete the sentence by inserting --the adhesive face, and a width of the crease roller is almost identical to a dimension between both collars.
    (6) When doing this, the crease is formed on places from which the top tape is to be lifted, and then the top tape can be lifted easily when such top tape comes up to the lifting roller.--.

In column 5, line 48, please start a new paragraph beginning with the word: "Further".

In column 6, line 16, please delete "(8)" and insert therefor --(7)--.

In column 6, line 43, please delete text beginning in column 6, line 43 starting with "In" and continuing up to column 7, line 23 ending with "be".

In column 8, line 33, please delete lines 32 through 48.

In column 22, line 27, please delete "rush" and please insert therefor --push--.

Signed and Sealed this

Seventeenth Day of March, 2009

JOHN DOLL
*Acting Director of the United States Patent and Trademark Office*